(12) United States Patent
Camargo et al.

(10) Patent No.: US 7,791,014 B2
(45) Date of Patent: Sep. 7, 2010

(54) OPTICAL DEVICE AND A METHOD OF MANUFACTURING AN OPTICAL DEVICE HAVING A PHOTOELECTRIC CONVERSION ELEMENT AND AN OPTICAL ADJUSTMENT ELEMENT

(75) Inventors: Edson Gomes Camargo, Tokyo (JP); Kazuhiro Nagase, Tokyo (JP); Masaaki Kurihara, Tokyo (JP); Yuichi Kanayama, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 0 days.

(21) Appl. No.: 11/885,887

(22) PCT Filed: Mar. 9, 2006

(86) PCT No.: PCT/JP2006/304652

§ 371 (c)(1), (2), (4) Date: Sep. 7, 2007

(87) PCT Pub. No.: WO2006/095834

PCT Pub. Date: Sep. 14, 2006

(65) Prior Publication Data

US 2008/0179503 A1    Jul. 31, 2008

(30) Foreign Application Priority Data

Mar. 9, 2005    (JP)    ............................ 2005-066062

(51) Int. Cl.
*H01J 3/14*    (2006.01)
*H01S 4/00*    (2006.01)

(52) U.S. Cl. ................. 250/239; 250/214.1; 250/208.1; 257/290; 257/431; 257/440

(58) Field of Classification Search ................. 250/239, 250/208.1, 214.1; 257/290–291, 431–434, 257/440, 80–84
See application file for complete search history.

(56) References Cited

U.S. PATENT DOCUMENTS 6,121,614 A    9/2000    Taniguchi et al.

(Continued)

FOREIGN PATENT DOCUMENTS

JP    56-83950    7/1981

(Continued)

*Primary Examiner*—Seung C Sohn
(74) *Attorney, Agent, or Firm*—Finnegan, Henderson, Farabow, Garrett & Dunner, LLP

(57) ABSTRACT

The present invention provides an optical device that is miniature, is highly sensitive and has a simplified package, and a manufacturing method thereof with high production efficiency and high reliability. The present invention is an optical device comprising: a photoelectric conversion element (50) having at least one photoelectric conversion portion (1) which is formed on a substrate (10); a sealing material (14); and a connection terminal (3). The optical device comprises an optical window which is an interface between the photoelectric conversion element (50) and an outside of the optical device; and an aperture (6) formed in the sealing material 14, and whose bottom face is the optical window. An entire face of the optical window is exposed to the outside. An optical adjustment element (13) may be formed on the interface. In this case, the interface between the optical adjustment element (13) and the outside is the optical window.

22 Claims, 15 Drawing Sheets

U.S. PATENT DOCUMENTS

| | | |
|---|---|---|
| 6,396,043 B1 * | 5/2002 | Glenn et al. .............. 250/208.1 |
| 6,580,077 B2 * | 6/2003 | Ito et al. .................. 250/338.3 |
| 2007/0090337 A1 | 4/2007 | Ueno et al. |

FOREIGN PATENT DOCUMENTS

| | | |
|---|---|---|
| JP | 4-217375 | 8/1992 |
| JP | 6-77526 | 3/1994 |
| JP | 9-288004 | 11/1997 |
| JP | 11-214754 | 8/1999 |
| WO | WO 2005/027228 A1 | 3/2005 |

* cited by examiner

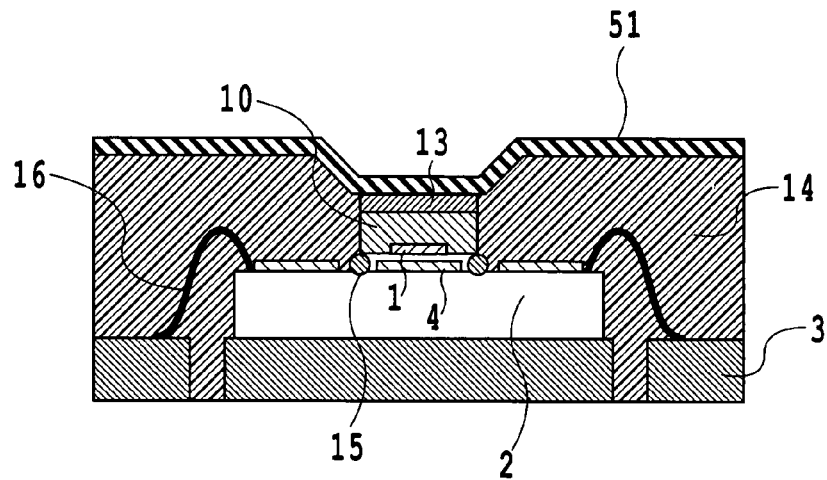
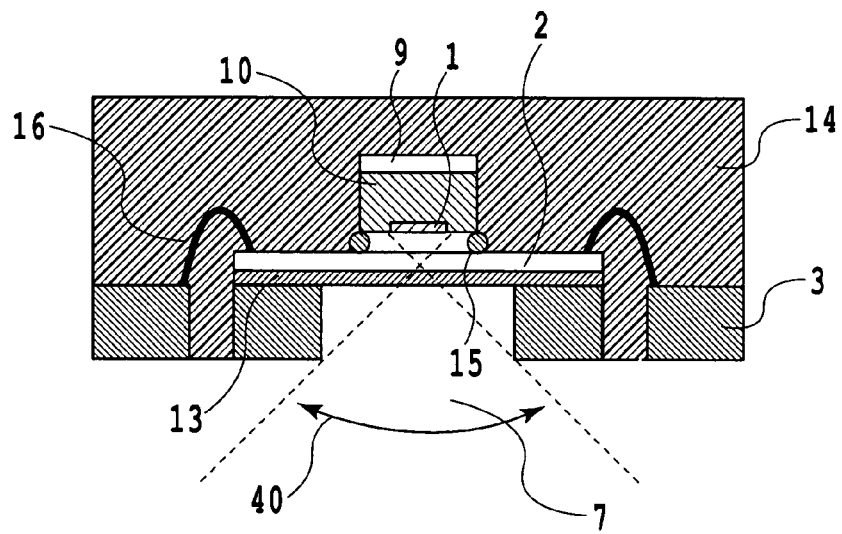

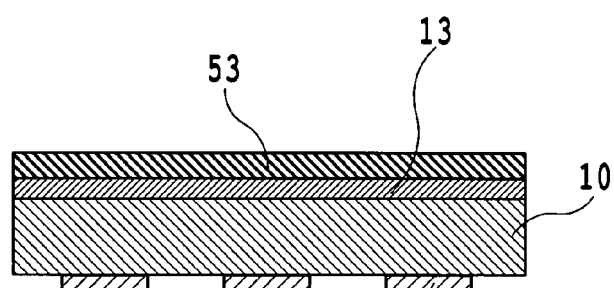
FIG.10A
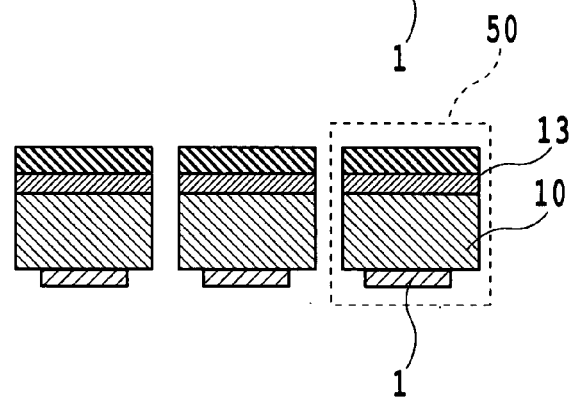
FIG.10B
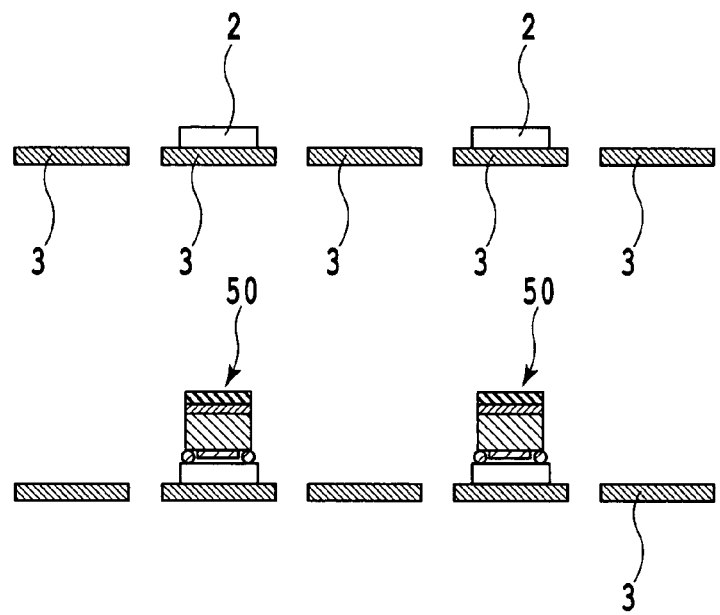
FIG.10C
FIG.10D
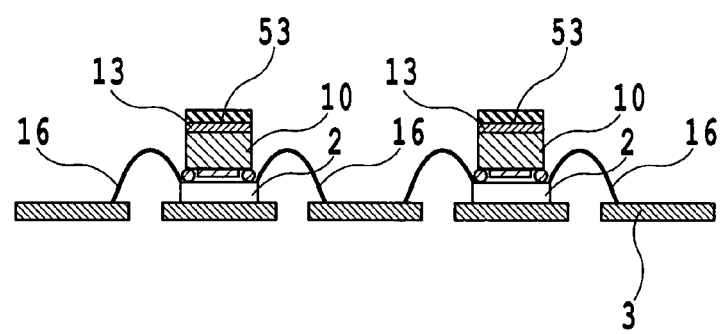
FIG.10E

OPTICAL DEVICE AND A METHOD OF MANUFACTURING AN OPTICAL DEVICE HAVING A PHOTOELECTRIC CONVERSION ELEMENT AND AN OPTICAL ADJUSTMENT ELEMENT

TECHNICAL FIELD

The present invention mainly relates to a passive or active optical device and a method of manufacturing the optical device.

BACKGROUND ART

In each of general electronic devices and optical devices, a sealing material of some kind is required in order to protect a semiconductor chip, which becomes the core of the device, and wiring. In a light emitting element which outwardly outputs an optical signal, or in an optical sensor which detects external light, particularly, the sealing material not only protects the semiconductor chip but also has an important role of fixing in some form a lens and an optical window which are used for derivation or introduction of light. In particular, in the case of a highly sensitive optical sensor, which detects a weak signal, the package of the sensor is designed so as to have the function of stabilizing the temperature of the sensing element, or blocking external electromagnetic noises against the sensing element. On the other hand, in order to produce a miniature device, while the size of a semiconductor chip should be made smaller, the package thereof should also be made smaller within the extent that performance of the device is not deteriorated.

In these manners, a lot of contrivances have been applied to a package of an optical device, in order to obtain a maximum performance in light detection sensitivity or light emission efficiency, which is an essential function of the optical device, while minimizing and simplifying the package. To achieve miniaturization of the package as a whole, packages using sealing resin is often used.

In each of general electronic devices other than optical devices, it is possible to obtain a very highly reliable package fabricated by using a mold because neither derivation nor introduction of light is necessary. On the other hand, in the case of an optical device, it is necessary to provide a optical window for derivation or introduction of light.

However, in a case where a optical window is formed by designing a mold such that the a window can be formed, and by performing a sealing step with the mold, it has been difficult to provide an adequate optical window aperture. This is because burrs of sealing resin inevitably remain on the optical window after the sealing step is performed, obstructing the light passage.

Additionally, in the case of attempting to form the optical window after a molding step with a sealing material, it is necessary to open a hole in the sealing material in some way. For example, in the case of attempting to perform etching so as to open a hole in the sealing material by a sandblasting method, the optical device may also possibly be destroyed.

For example, Patent Document 1 discloses a mold for providing a optical window of an optical device to a miniature package covered with a sealing material. Specifically, inside of this mold, provided is an elastic body configured to be into contact under pressure with the front face of the optical window of the element which detects light, and accordingly the mold prevents the sealing material from entering the optical window of the element during a sealing step. On this optical window, a light blocking film having a pinhole to determine the direction of entrance or exiting of light is formed. Accordingly, a large portion of light entering the optical window is blocked not by the sealing material but by the light blocking film, and only a part of the entering light enters the pinhole. Hence, desired light detected by the element which detects light does not pass through the entire face of the optical window.

Here, if a method disclosed in Patent Document 1 is used, since the elastic body is pressed in the sealing step on the element which detects light, and the element may possibly be broken. Additionally, burrs of the sealing elements remain on the optical window in some cases, and it is necessary to perform a step of removing burrs by a physical etching method or the like in order to form a desired optical window aperture. For this reason, there has been a problem where reliability of manufacturing steps becomes low. Because burrs of the sealing material enter the optical window from a periphery thereof toward a central element thereof in the sealing step, especially, darkening due to burrs is a serious problem in a case where the optical window needs to transmit light with a high transmittance. Furthermore, in a case where the optical window is provided with a function of adjusting the intensities of light input and output, it is impossible to use the step of removing burrs because the optical device could be destroyed. This results in a problem of extremely low productivity.

On the other hand, it is necessary to provide some kind of optical window for an infrared sensor which detects light in the infrared region (for example, light having long wavelengths of 5 to 10 microns). This is because there is no resin material that efficiently transmits the infrared light having long wavelengths, and thus because an epoxy resin package used for an infrared sensor which detects infrared light of not more than about 1 micron, cannot be directly used. For this reason, in a conventional infrared sensor, it is necessary to use a hollow package or a metal package to provide, apart from a sensor element, an optical window material capable of efficiently transmitting light so that sensitivity of the sensor would not be reduced. However, there has been a problem that utilization of a hollow package makes it difficult to miniaturize the sensor, and also, complicates assembly.

Additionally, miniaturization of an infrared sensor for long wavelengths has not been possible so far because it is necessary to enlarge the area and the volume of a photoelectric conversion portion in an infrared sensor for long wavelengths so as to obtain a high S/N ratio, and also because it has been necessary to provide a cooling unit even in the case of a quantum type sensor which is said to be highly sensitive.

Likewise, in an ultraviolet sensor which detects ultraviolet light having wavelengths of not more than 300 nm, it is necessary to use a optical window material made of quartz glass, sapphire glass or the like because ultraviolet light cannot pass through an epoxy resin that allows visual light to pass there through and is used in a photodiode for visual light and the like. Accordingly, fabrication of an optical device that is miniature and is easy to package has not been possible. Thus, an application range of ultraviolet sensors has been limited.

Next, in the case of an infrared sensor which normally outputs weak signals, a circuit which processes the output signal from the sensor becomes necessary in addition to a photoelectric conversion portion. In such a case, the output signal from the infrared sensor comes to function as a sensor after going through an amplification circuit and a circuit which performs comparison processing, and is generally composed of pluralities of resistance components, capacity components, signal processing circuits, and the like. Accordingly, a range of utilization of infrared sensors has been limited for such reasons that miniaturization of the size of a sensor is difficult if a element corresponding to the signal processing circuits is included in the size in addition to the sensor composed of a metal package, and that the number of manufacturing steps is large.

In response to this, as is disclosed in Patent Document 2, a method of attempting miniaturization by additionally packing a signal processing circuit into a metal package has been proposed. However, also in this method, there is a problem that reduction in size and thickness is difficult because it is necessary to avoid influence of heat between a pyroelectric sensor and the signal processing circuit obtained by integrating signal processing circuits including an amplification circuit as a core; and to provide a optical window material that efficiently transmits infrared light having long wavelengths.

Accordingly, conventional optical devices have a problem that they cannot be miniaturized for restrictions on the package of the sensor.

Patent Document 1: Japanese Patent Laid-open No. Hei6-77526

Patent Document 2: Japanese Patent Laid-open No. Hei9-288004

Patent Document 3: International Publication Number WO2005/027228

DISCLOSURE OF THE INVENTION

An object of the present invention is to provide an optical device that is miniaturized, is highly sensitive, and has a simplified package, and a manufacturing method thereof that has high production efficiency, and is highly reliable.

In order to achieve such an object, one embodiment of the present invention is an optical device comprising: one or more elements including a photoelectric conversion element having a photoelectric conversion portion which is formed on a substrate; a connection terminal electrically connected to the photoelectric conversion element; and a sealing material which seals the one or more elements and the connection terminal, wherein the optical device comprises an aperture in one side thereof through which light is allowed to enter or exit, and a bottom face of the aperture is an interface between an element out of the one or more elements that is the closest to the outside, and the outside.

Additionally, the element that is the closest to the outside may be the photoelectric conversion element out of the one or more elements. The photoelectric conversion element and the connection terminal may be connected to each other through a signal transfer element. The aperture may be located, in any one of the sealing material and the connection terminal, in the one side through which light is allowed to enter or exit. The element that is the closest to the outside may include an optical adjustment element on the interface thereof with the outside.

Additionally, the optical device may further include connection wiring formed of at least any one of a metal ball, a metal bump and a metal wire, the connection wiring electrically connecting at least one element out of the one or more elements, and the connection terminal to each other, and the connection wiring may be sealed by the sealing material.

Additionally, a face of the photoelectric conversion element which is opposed across the photoelectric conversion portion to a face thereof through which light enters or exits may include at least any one of: a shielding plate which absorbs electromagnetic noise; and a light reflection plate which increases an absorption or emission efficiency for the light. At least a part of the element that is the closest to the outside may be unexposed, and be covered by the one of the sealing material and the connection terminal in which the aperture is formed. A face of the photoelectric conversion element which is opposed across the photoelectric conversion portion to a face thereof through which light enters or exits may include at least any one of: a shielding plate which absorbs electromagnetic noise; and a light reflection plate which increases an absorption or emission efficiency for the light. At least a part of the element that is the closest to the outside may be unexposed, and be covered by the one of the sealing material and the connection terminal in which the aperture is formed.

Additionally, the photoelectric conversion portion may perform any one of detection and emission of light in the infrared region. The photoelectric conversion portion may be a quantum type photoelectric conversion portion capable of operating at a room temperature. The photoelectric conversion element may have a plurality of photoelectric conversion portions connected in series. The quantum type photoelectric conversion portion may belong to at least any one of a photoconductor type, a photodiode type, a phototransistor type and a LASER diode type, and the quantum type photoelectric conversion portion may include: a layer formed of a compound semiconductor containing at least any one of In and Sb; and a barrier layer for suppressing a diffusion current.

Another embodiment of the present invention is a manufacturing method of an optical device comprising one or more elements including a photoelectric conversion element having a photoelectric conversion portion which is formed on a substrate; a connection terminal electrically connected to the photoelectric conversion element; and a sealing material which seals the one or more elements and the connection terminal, the method comprising: a sealing step of sealing at least a part of the connection terminal and the one or more elements by the sealing material; and an aperture forming step of forming an aperture on one side of the optical device through which light is allowed to enter or exit so that a bottom of the aperture can be an interface between an element out of the one or more elements that is the closest to the outside, and the outside.

Additionally, the element that is the closest to the outside may be the photoelectric conversion element out of the one or more elements. The photoelectric conversion element and the connection terminal may be connected to each other through a signal transfer element.

Additionally, in the aperture forming step, the aperture may be formed, in the one side through which light is allowed to enter or exit, in any one of the sealing material and the connection terminal.

Additionally, the manufacturing method may further include, before the sealing step, a first protective film forming step of forming, in a region of the element that is the closest to the outside which corresponds to the interface, a first protective film for protecting the interface, and at least a part of the connection terminal, the photoelectric conversion element, and the first protective film may be sealed by the sealing material in the sealing step. The first protective film maybe a photosensitive protective film. The method may further include, after the aperture forming step, a first protective film removing step of removing the first protective film. In the aperture forming step, if the thickness of the first protective film is denoted as t, etching may be performed to the depth x ($0 \leq x \leq t$) from a surface of the first protective film by using the surface of the first protective film as a basis.

Additionally, in the aperture forming step, the aperture may be formed by etching utilizing a physical technique. The etching utilizing a physical technique may be sandblast etching.

Additionally, the aperture may be formed in the sealing material, and the manufacturing method may further include, between the sealing step and the aperture forming step, a second protective film forming step of, on a face of the sealing material, forming a second protective film for protecting at least a part of the sealing material except for the aperture, the face being intended to have the aperture formed thereon.

Additionally, the aperture may be formed in the connection terminal, the connection terminal may have a penetrating pattern, and the sealing material having entered the pattern in the sealing step may be removed in the aperture forming step.

Additionally, the manufacturing method may include, before the sealing step, a step of electrical connection of the signal transfer element and the photoelectric conversion device to each other and also, electrically connecting the signal transfer element and the connection terminal to each other, and at least a part of the connection terminal, the photoelectric conversion element, and the first protective film may be sealed by the sealing material in the sealing step, the signal transfer element including at least any one of: a signal processing circuit which processes the output from the photoelectric conversion element; a driver circuit which drives an electric signal directed to the photoelectric conversion element; and an interposer which electrically connects the photoelectric conversion element and the connection terminal to each other.

According to the present invention, an optical device that is highly reliable and is excellent in light input or output characteristic as compared to conventional ones can be obtained. Additionally, a simple and highly productive manufacturing method thereof can be provided. The optical device and manufacturing method thereof of the present invention become an effective structure and a manufacturing method thereof especially in the case of a miniaturized and low-profile optical device. Furthermore, in an optical device where light in the infrared region is allowed to enter or exit, a miniaturized and highly reliable optical device having not been able to be realized by conventional methods can be efficiently manufactured.

BRIEF DESCRIPTION OF THE DRAWINGS

FIG. 3A is a cross-sectional view of an optical device in the case of using an electromagnetic shielding plate or a light reflection plate according to the one embodiment of the present invention;

FIG. 3B is a cross-sectional view of an optical device in the case of using an electromagnetic shielding plate or a light reflection plate according to the one embodiment of the present invention;

FIG. 10A is a schematic view of a manufacturing method of an optical device provided with the signal processing circuit according to the one embodiment of the present invention;

FIG. 10B is a schematic view of the manufacturing method of the optical device provided with the signal processing circuit according to the one embodiment of the present invention;

FIG. 10C is a schematic view of the manufacturing method of the optical device provided with the signal processing circuit according to the one embodiment of the present invention;

FIG. 10D is a schematic view of the manufacturing method of the optical device provided with the signal processing circuit according to the one embodiment of the present invention;

FIG. 10E is a schematic view of the manufacturing method of the optical device provided with the signal processing circuit according to the one embodiment of the present invention;

BEST MODE FOR CARRYING OUT THE INVENTION

Figure 1A:
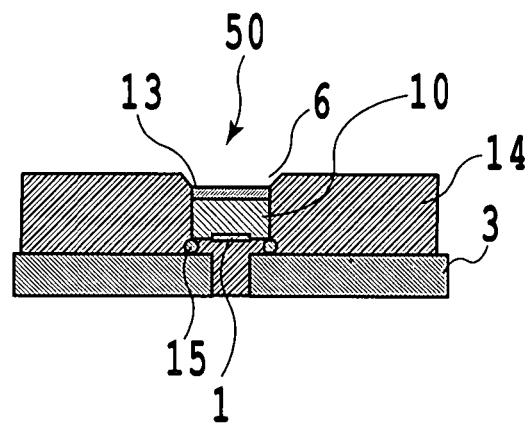
FIG. 1A is a cross-sectional view of an optical device according to one embodiment of the present invention.

Embodiments of the present invention will be described in detail below with reference to the drawings. Note that, in the drawings described below, the same reference numerals are given to elements having the same functions, and that repetitive description thereof will be omitted.

The present invention proposes an optical device which requires an optical window for allowing light to enter or exit (introducing or deriving light), and can be sealed with resin. That is, in the present invention, elements (a photoelectric conversion element such as a light emitting element or a light receiving element, or a signal transfer element such as a signal processing circuit, and the like) sealed by the sealing material come to be exposed while forming an interface with the outside, and a region thus exposed becomes a optical window for the light path. In the present invention, the elements sealed by the sealing material at least include a photoelectric conversion element, and can include a signal transfer element such as a signal processing circuit. As has been described above, the optical window is an interface with the outside in a predetermined element out of the elements sealed by the sealing material. Therefore, considering that the predetermined element has the interface with the outside provided as the optical window, the predetermined element is an element, out of the elements sealed by the sealing material, that is the closest to the outside in one side of the optical device through which light is derived and introduced.

Note that it is preferable to configure the optical window so that light having a desired wavelength can permeate an entire face of this region thus exposed. The light having a desired wavelength is the light having a wavelength that can be absorbed or emitted by the photoelectric conversion element sealed by the sealing material. For example, in the case where a light-emitting element is sealed, light is emitted from the light emitting element, or, in a case where a light receiving element is sealed, the light having a wavelength absorbable by the photoelectric conversion element, will be absorbed by the photoelectric element, which will generate an electric signal proportional to the incoming light amount. e.

In the present invention, even though the photoelectric conversion element is sealed by the sealing material, light having the desired wavelength enters or exits that element through the optical window. For this reason, even in a case where the element is sealed by a sealing material which does not transmit light in the infrared region nor in the ultraviolet region, or the like, the inclusion of the optical window will allow the optical deriving or introducing.

Additionally, in the present invention, it is preferable the aperture for derivation or introduction of light to be formed in the sealing material itself, making unnecessary any additional element for the light path, whereby a very miniature package can be realized. This aperture may also be formed in the connection terminal as will be described later. In this case, the bottom face of the aperture formed in the connection terminal becomes the optical window for the light, and the photoelectric conversion element or the signal transfer element comes to be exposed from this optical window.

In the present invention, an aperture includes a through hole formed in the sealing material or the connection terminal. Additionally, in the case of a device with the light optical window matching the side having the connection terminal, a penetration hole in the connection terminal is provided for the light path, which will be used as aperture. The aperture refers to a penetration area formed in the sealing material or in one side of the connection terminal through which light is derived or introduced, having a bottom face used as light optical window.

In addition, the depth of the aperture is not limited. That is, if the depth of the aperture is denoted as a symbol h, the depth is expressed as h>0. This depth h is a distance from an edge of the aperture to the bottom face of the aperture. Note that, in the case where a large number of the optical devices are manufactured, among them, some optical devices having h=0 could be manufactured. On the other hand, it would be difficult to manufacture a large number of optical devices uniformly having h=0. Although it is not a problem, because in many of the cases h would no interfere on the optical properties of the device. In a production line, the depth h could be fixed after measuring the typical aperture depths of a large number of optical devices.

As has been described, because the aperture is formed in the sealing material or the connection terminal, the bottom face of the aperture comes to reach the element (the photoelectric conversion device or the signal transfer element) that is the closest element to the outside, in one side of the optical device where the aperture of the sealing material or the connection terminal is formed. Hence, an interface between the element and the outside is formed at the bottom of the aperture, and the element comes to be exposed (to form an interface with the outside). In this way, the bottom face of the aperture becomes the light optical window.

In the present invention, the aperture has the function of guiding light from the outside to the optical window, and the function of guiding light from the optical window to the outside. That is, because the bottom face of the aperture is directly the optical window since the aperture is a opened space having no obstructing elements, such as the sealing material, or the connection terminal. Light from the outside can enter the optical window through the aperture and then enter the photoelectric conversion portion of the photoelectric conversion element. Additionally, light from the photoelectric conversion portion can enter the optical window to pass through the aperture, and exit to the outside. Since there is no obstructing substances present on the aperture, like sealing material or burrs of the sealing material, light can directly enter (or exit the optical window) optical window, with no intensity attenuation, whereby the optical device of the present invention is enabled to efficiently receive light, or to efficiently irradiate emitted light to the outside.

The optical device of the present invention particularly designates: an optical sensor; a light emitting device which emits light; an active optical sensor which emits light and then detects reflection light having reflected by a detected object; or the like. As a basic structure thereof, the optical device includes: a photoelectric conversion element which detects or emits light; a sealing material which becomes the package of the device; and a optical window for derivation or introduction of light. Since the number of parts becomes very small, by using this structure, miniaturized, high-performance and highly reliable optical device can be realized.

Additionally, in the optical device of the present invention, because light inevitably passes through the interface (the optical window) between the outside and the element, it is preferable, in order to maximize a light reception sensitivity of the optical device, or a light emission efficiency thereof, the optical window to be provided with a function of light antireflection, light focusing, or wavelength selectivity. For this purpose, in the present invention, the optical device may further include an optical adjustment element which adjusts, in the optical window element, the optical input or output characteristic. Accordingly, in the present invention, not only the photoelectric conversion portion but also the optical window has an important role. Note that, in the present invention, the optical adjustment element can be formed integrally with an element such as the later described photoelectric conversion element or signal transfer element that is the closest to the outside in a face through which light is derived and introduced. Thus, in the case of forming the optical adjustment element, an interface between the optical adjustment element and the outside becomes the optical window element.

Additionally, the manufacturing method of the optical device of the present invention includes a step of forming the aperture in the sealing material or the connection terminal. By configuring the manufacturing method in this way, it becomes possible to avoid or reduce the remaining, on the optical window, of the sealing material, and the sealing material existing in the form of burrs, which hinder entrance and exiting of light. Furthermore, in order not to destroy the optical window and the optical adjustment element of the optical device, it is preferable a protective layer (a later described first protective film), which protects the optical window element or the optical adjustment element, to be formed before the sealing step, and also the aperture opening step to expose the optical window, there through to be performed after the sealing step. By configuring the manufacturing method in this way, even when an aperture in the sealing is formed using a physical technique, the optical window and the optical adjustment element are not destroyed or flawed, and a highly reliable process can be realized, obtaining a miniaturized optical device with high production efficiency and stable performance.

As has been described above, for example, in a case where the optical device detects an optical signal, the optical signal intended to be detected can be transmitted to the photoelectric conversion portion without being optically attenuated. Furthermore, it is made possible to reduce influence of electromagnetic noise from the outside by connecting an output signal from a sensor to a signal processing circuit with the shortest distance, whereby optical detection sensitivity can be improved.

In cases in each of which the photoelectric conversion portions is fabricated on a substrate made of sapphire, Si, GaAs, InP, GaP or the like by using a thin film growth method, many of such devices have a characteristic that the substrate itself used for thin film growth transmits an operational wavelength of each of the devices. In the present invention, in a case where the optical window element is formed on the photoelectric conversion element, realization of a light emitting or light receiving device that is miniaturized and requires a small number of manufacturing steps is made possible by utilizing the above mentioned manufacturing configuration. Specifically, the back face of the substrate where the photoelectric conversion portion is formed, is exposed from the package, so that light is allowed to be introduced, in the case of light detection, or emitted, in the case of light emitting devices. Additionally, an active sensor or light emitting device can be realized by incorporating a light emitting portion and a light receiving portion in the same sealing package.

By utilizing the manufacturing method of the present invention in a manner as will be described later, it becomes possible to make use of the substrate itself as the optical window, whereby the size of the package becomes smaller, and the number of assembling steps can be reduced with the reduction in the number of parts.

Note that, in the present description, the back face of a substrate indicates a face of the substrate opposite to a face thereof on which the photoelectric conversion portion composing the photoelectric conversion element is formed.

An optical device according to one embodiment of the present invention has a photoelectric conversion element sealed by a sealing material, and includes a optical window element for allowing light to enter the photoelectric conversion element, the photoelectric conversion element including one or more photoelectric conversion portions. The size of this optical window can be made as large as a part or an entirety of the surface of the photoelectric conversion element. Additionally, the optical window may be formed in the signal transfer element side, and correspond to a part or an entirety of a face thereof. Since this optical window is an interface between the outside and an element, the sealing material does not exist on the optical window element, and the element (the photoelectric conversion element or the signal transfer element) including the optical window comes to be exposed. For example, in the case where the optical window is placed on the photoelectric conversion element, because the substrate composing the photoelectric conversion element transmits light having an operational wavelength of the device as has been described above, light comes to permeate an entire face of the optical window. Additionally, parts other than the optical window is sealed by the sealing material.

Note that, not an entirety, but only a part of the photoelectric conversion element (or the signal transfer element) on which the optical window is set as the optical window as has been described above, that is, if at least a part of a face of the photoelectric conversion element (or the signal transfer element) in the one side through which light enters or exits is configured to be unexposed, the unexposed part of this face comes to be sealed by the sealing material. The sealing material on the unexposed part of this face serves to hold the sealed photoelectric conversion element (or the signal transfer element), and thereby becomes effective in preventing the element from being damaged by physical shock. For example, when the optical window is quadrilateral, if four corners of a face of the photoelectric conversion element are left covered by the sealing material without being exposed, the sealing material on the four corners function as a stopper because, while the optical window is exposed, the sealing material exist on the four corners. Accordingly, when a physical shock is applied to the optical device, the photoelectric conversion element can be prevented from going out from a region of the sealing material corresponding to the optical window. Although the size of the optical window thus has an area of not more than the size (when viewed from a direction in which light enters or exits) of the element (the photoelectric conversion element or the signal transfer element) having the optical window. In order to improve a derivation or introduction intensity of light, the larger the size of the optical window relative to the element having the optical window, the more preferable, and, specifically, the size thereof is preferably not less than 30%, more preferably not less than 50%, and further more preferably not less than 80%.

Additionally, the sealing material included in the optical device according to the one embodiment of the present invention is provided with an aperture which has a function of deriving light from or introducing light into the optical window. This aperture is formed in the sealing material. Alternatively, the connection terminal in some cases is provided with the aperture having a function of introducing light into the optical window. In each of these cases, the aperture is formed in the connection terminal. Furthermore, the optical window may have an optical adjustment element which improves the optical input or output characteristic. In addition, the photoelectric conversion element includes a substrate, and a photoelectric conversion portion which is formed on the substrate for energy conversion between optical energy and electric energy.

To be precise, a purpose in forming the optical window in the present invention is to allow light to enter from the outside to, or to allow light to exit to the outside from the photoelectric conversion element sealed by the sealing material even in a case where the sealing is made by a sealing material that does not transmit the operational wavelength (for example, infrared light or ultraviolet light) of the optical device. In addition, for this purpose, at least a part of a face of the element (for example, the photoelectric conversion element or the signal transfer element) that is the closest from the outside in the one side through which light is derived or introduced is exposed to the outside from the sealing material. Thus, in the element having the optical window, a part other than the optical window comes to be sealed by the sealing material.

(Regarding Basic Element Structures)

Preferable arrangements of these elements will be described by using FIGS. 1A to 1E.

FIG. 1A is a cross-sectional view of an optical device according to the one embodiment of the present invention. In FIG. 1A, a photoelectric conversion element 50 includes a substrate 10 and a photoelectric conversion portion 1 formed on the substrate 10. In addition, the photoelectric conversion element 50 is sealed by the sealing material 14. In addition, an aperture 6 is formed in the sealing material 14 so that the photoelectric conversion element 50 can meet the outside by a optical window element having an optical adjustment function. A bottom element of this aperture 6 becomes the optical window, and an optical adjustment element 13 is exposed from the bottom element. In a case where the optical adjustment element is not formed, it goes without saying that the substrate 10 is exposed from the optical window. In this way, light received or emitted by the photoelectric conversion element 1 can be efficiently allowed to enter from or exit to the outside through the optical window by passing though the aperture 6.

The photoelectric conversion portion 1 of the present invention is formed on the substrate 10, and performs photoelectric conversion by which incident light is converted into an electric signal, or by which an electric signal supplied from outside is converted into light. This structure is not particularly limited, and the photoelectric conversion portion can be selected from: a quantum type photoelectric conversion portion (a photoelectric conversion portion utilizing photo conductivity, a photovoltaic effect, and light emission of a semiconductor material having a band gap agreeing with an intended wavelength) which performs light reception and emission based on electronic transition or recombination by light; or a thermal type photoelectric conversion portion which absorbs optical energy, then converts it into heat, and then transmits it in a thermal mode. In the optical device according to the present invention which uses the sealing material, the quantum type photoelectric conversion portion is preferably used because influence of heat transmission with the sealing material is small. As the quantum type photoelectric conversion portion, any one of an LED (Light Emitting Diode) type and an LD (Laser Diode) type is preferable, as they each have a high light emission efficiency, in the case of a light emitting device, whereas any one of a photodiode, a solar cell and a phototransistor is preferable, as they each have a high light receiving sensitivity, in the case of an optical sensor. In the case of the heat type photoelectric conversion portion, a light-receiving type photoelectric conversion portion can be mainly utilized, and a pyroelectric type, bolometer type or thermopile type photoelectric conversion portion is preferably used.

Here, it is desirable that the quantum type photoelectric conversion portion capable of operating at a room temperature be used as the photoelectric conversion portion 1. By thus having the photoelectric conversion portion be the quantum type one capable of operating at a room temperature, the structure of the optical device of the present invention becomes a structure with a combination of a favorable photoelectric conversion characteristic and stability. Especially in the case where the optical device of the present invention is an optical device which inputs or outputs light (receives light or emits light) in the infrared region, the optical device of the present invention more effectively functions as a structure which is improved in responsiveness due to heat accumulation of the sealing material, is simple, and is excellent in stability.

Particularly in the case of an optical device which inputs or outputs light in the infrared region, there can be exemplified an optical device where the photoelectric conversion portion 1 is formed of any one of materials such as: a compound semiconductor (for example, a material made of $InAs_xSb_{1-x}$ ($0 \leq x \leq 0.75$)) containing at least any one of In and Sb; and HgCdTe. Among those materials, the compound semiconductor containing at least any one of In and Sb is preferably used, and is preferable, as it becomes highly sensitive, particularly in a case including a barrier layer which suppresses an electron diffusion current. Furthermore, a photoelectric conversion element utilizing, photoelectric conversion portions formed by photodiodes utilizing $InAs_xSb_{1-x}$ ($0 \leq x \leq 0.75$) barrier layers which suppresses electron diffusion current, is preferable because of its higher sensitivity. This x is appropriately selected by considering an absorption wavelength of the material, easiness of manufacturing, and the like. (See reference to Patent Document 3.)

Additionally, particularly in the case of an optical sensor (a light-receiving type photoelectric conversion element) which operates in the far infrared region, a photodiode which operates in a solar cell mode may be utilized as the photoelectric conversion portion 1 so that noise by an electric current can be suppressed. In this case, if an open voltage of the solar cell is utilized as an output signal, an optical sensor with higher S/N ratio (signal/noise ratio) can be realized. In order to further intensify the output signal, and also to improve the S/N ratio, it is preferable that a plurality of solar cells (which correspond to the photoelectric conversion portion) be connected in series. That is, by composing the photoelectric conversion element by a plurality of photoelectric conversion portions connected in series, a large output signal can be obtained especially in a case where the output signal is extracted in the form of voltage. This is because an infrared sensor is particularly susceptible to thermal noise, and the S/N ratio thereof with respect to noise attributable to thermal noise can be improved by the connection in series. The number of cells (photodiodes) to be serially connected is not particularly limited and may be selected as appropriate in consideration of a magnitude of the output signal, and the S/N ratio. It is preferable that the number of those serially connected is not less than 10, because a magnitude of the output signal and the variance in the S/N ratio become remarkable. For the same reason, it is more preferable that the number is not less than 100, and it is further more preferable that the number is not less than 500. There is no restriction on an upper limit of the number, and the upper limit is selected as appropriate in consideration of a size of the sensor and an output thereof.

The optical device as has been described is a quantum type, from which a high output can be obtained at a room temperature without using a cooling systems. In the case where the optical device of the present invention is an optical device receiving or emitting light in the infrared region, especially, in a case where it is an infrared sensor, a structure of the present invention can be more preferably used. This is because a device in the structure disclosed in the present invention, high in response speed, highly sensitive and miniaturized can be easily obtained by employing the above mentioned structure which allows high output signal at a room temperature, with improved S/N ratio.

In the present invention, while the photoelectric conversion portion is formed on the substrate, the substrate is not particularly limited, and a material suitable for forming a material composing the photoelectric conversion portion is selected. Specifically, a semiconductor substrate made of silicon, GaAs, InP, GaP or the like, or a general-purpose substrate such as GaN, AlN, a sapphire substrate, or a glass substrate is used.

Figure 1B:
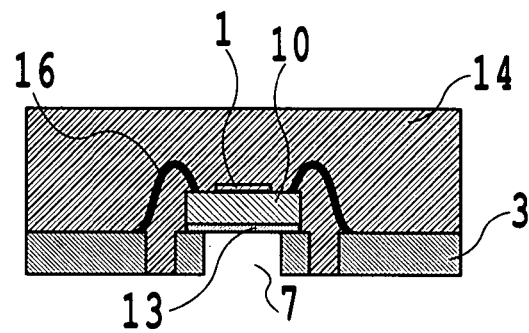
FIG. 1B is a cross-sectional view of an optical device according to the one embodiment of the present invention.
Figure 1C:
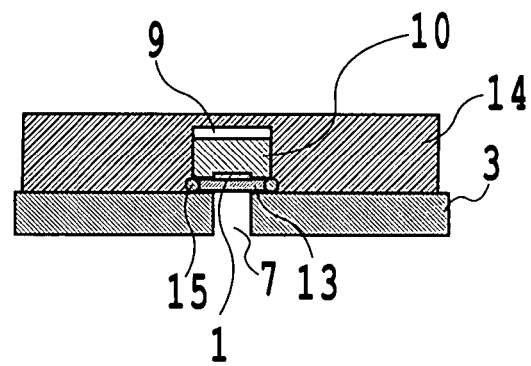
FIG. 1C is a cross-sectional view of an optical device according to the one embodiment of the present invention.

In the present invention, a direction of deriving light from or introducing light into the photoelectric conversion element is not particularly limited, and light may be derived or introduced through the substrate side (the back face side) of the photoelectric conversion element as shown in FIG. 1A, or may be derived or introduced through the photoelectric conversion portion side of the photoelectric conversion element as shown in FIG. 1C. In the case where wiring is formed on the photoelectric conversion portion by using metal, it is preferable the light to be derived or introduced through the substrate side (the back face side), because metallic elements normally do not transmit but reflects the light. Especially in a case where two or more of photoelectric conversion portions being connected in series, metal is often used to provide this connections, while light utilization efficiency can be enhanced (due to light reflection, and reuse of reflected light).

In the case as described here, it is necessary that the substrate be transparent against light having a wavelength received or emitted by the photoelectric conversion portion. Accordingly, in a case where the photoelectric conversion portion is formed by using a thin film growth method, it is preferable that a material forming the photoelectric conversion portion, and a material forming the substrate be different materials. For this reason, in a case where a semiconductor substrate is used, it is preferable that the semiconductor having a narrower gap than the substrate be used as the photoelectric conversion portion. For example, in a case where the photoelectric conversion portion is formed of a III-V group semiconductor, it is preferable to use a silicon substrate, and to use a III-V group semiconductor having a narrower gap than silicon, deposited on silicon, as the photoelectric conversion portion. Additionally, it is preferable to use a GaAs substrate, and to use a III-V group semiconductor having a narrower gap than GaAs, deposited on the GaAs substrate, as the photoelectric conversion portion.

The optical device of the present invention includes the optical window for allowing light to enter from the outside, or to allowing light to exit to the outside. The optical window designates an interface between the outside and an element, the interface not covered by the sealing material or the connection terminal. That is, a role thereof is deriving light from or introducing light into the photoelectric conversion portion. In a case where it is desired that light be derived or introduced though the substrate side (the back face side) of the photoelectric conversion element, an interface between a surface of the substrate of the photoelectric conversion element and the outside becomes the optical window. Meanwhile, in a case where it is desired that light be derived or introduced though a side opposite to the substrate side, an interface between the outside and a signal transfer element such as a signal processing circuit or the like that is the closest to the outside among elements included in the optical device, becomes the optical window. In addition, an optical adjustment element may be formed on the interface (the optical window). In a case where this optical adjustment element is formed, the exposed optical adjustment element becomes the optical window.

In the present invention, in order to derive light from and introduce light into the photoelectric conversion portion, the optical window is formed by removing a region of the sealing material or the connection terminal, whereby a surface of an element that is closest to the outside is exposed, the region corresponding to the optical window element. When this optical window element is removed, only a surface of the sealing element may be removed so as to form the optical window element, or, an aperture (a through hole) may be formed in the sealing material or the connection terminal to have a bottom element of the aperture formed as the optical window.

Additionally, in the aperture 6 formed in the sealing material 14, while each of side faces of the aperture 6 is formed so to have a certain slope as shown in FIG. 1A, there is no particular restriction on the slope, and the slope may be perpendicular to the optical adjustment element 13. The field of view (optical field of view of the device) can also be controlled by controlling the angle of the slope.

The optical adjustment element 13 designates a region which is formed by surface treatment of some sort in the optical window, and which adjusts the way of derivation and introduction of light. In the conventional optical device, in a case where this optical adjustment element is housed in a metal package, the optical adjustment element is provided as a part separate from the photoelectric conversion portion in such a manner as to be formed on a lid element of this metal package. In contrast, the optical adjustment element of the present invention is formed on the same substrate as the photoelectric conversion portion, or on the signal transfer element, that is electrically connected to the photoelectric conversion element and arranged so as to face it. This is because, as a surface of an element out of elements (a photoelectric conversion element and a signal transfer element) that corresponds to a desired configuration and is the closest to the outside comes to be exposed, the optical adjustment element and any one of the photoelectric conversion element and a signal circuit element can be integrated. For this reason, the number of parts is reduced, and a very thin optical device can be realized because an unnecessary space from the optical adjustment element to the photoelectric conversion element can be reduced by the above described integration. In addition, by allowing the optical device to include this optical adjustment element, the effect of the manufacturing method using the later described first protective film becomes still more remarkable. Note that, as has been described above it is preferable the entrance or exiting of light to be allowed through the back face side of the photoelectric conversion element, and it is preferable the optical adjustment element to be formed on a face (a back face) of the photoelectric conversion element that is opposite to a face thereof on which the photoelectric conversion portion is formed.

The optical adjustment element 13 plays an important role of practical enhancement of the optical device such as optical conversion efficiency, operational wavelength, and condensing of received or emitted light. Specifically, the optical adjustment element 13 is any one of: a light anti-reflection element which prevents reflection of light in the optical window; a filter which controls a wavelength of received light or emitted light; and an optical lens which controls detection of light, and an exiting direction of light, and condenses light. As the light anti-reflection element, any one of a anti-reflection layer, and a scattering control layer which controls a ratio of a forward scattering to a backward scattering is used. Additionally, as the lens, any one of a lens having asperities, and a Fresnel lens is selected as appropriate in accordance with a purpose thereof. In addition, while they are formed in the optical window, there can be listed as specific forms thereof: a light anti-reflection film or a filter which can be formed on a surface of the optical window element; an optical lens which can be processed on the surface of the optical window; or a processed configuration formed by a surface treatment of some sort. As the processed configuration, there can be exemplified: one in which an intensity of light derivation or introduction has been improved by a scattering effect by adjusting a roughness thereof by a physical or chemical technique; and one in which an incident or outgoing angle of light has been adjusted by changing a configuration thereof. Additionally, the optical adjustment element may be provided also with a function of becoming a protection against deterioration which occurs by having the photoelectric conversion element meet with external air. Additionally, a layer having the protection function may be placed, independently of the optical adjustment function, in one side of the optical adjustment element which meets the outside.

Among these, the light anti-reflection element (the anti-reflection layer, or a light derivation/introduction improvement layer using a scattering effect) greatly improves a photoelectric conversion performance of the photoelectric conversion element, and thereby is suitably used. Especially in a case where a refractive index of an element having the optical window is high, the light anti-reflection element is effective, and a material having, in the interface where the optical window element meets the outside, a refractive index that is lower than that of the optical window element is suitably used. The light derivation/introduction improvement layer using a scattering effect may be obtained by improving a roughness of an exposed element of the substrate, or by separately setting up a layer whose surface has an appropriate roughness. Particularly in a case where light is allowed to enter or exit though the back face of the substrate, an optical adjustment element formed by controlling a roughness of the back face of the substrate by a polishing method or the like.

The optical filter has a function of cutting out light, which has wavelength ranges other than a desired one, by having a multilayered layer structure and a single-layered layer structure provided thereto, and is suitably used especially in a case where the photoelectric conversion element is a light receiving element.

The optical lens is suitably used in a case where control of an entering or exiting direction of light, or light condensing is necessary, and a Fresnel lens is suitably used because of easiness to be formed on the optical window.

Additionally, as will be described later, in a case where, while the optical device includes a signal transfer element, light enters and exits through the signal transfer element side, the optical adjustment element is formed on the optical window (an interface of the element with the outside) formed on the signal transfer element, and is used for the purpose of controlling: an intensity of light entering and exiting the photoelectric conversion portion through the signal transfer element; and the like. Accordingly, the optical adjustment element is designed, for example, in consideration of an optical characteristic of a material (such as air or a resin) existing between the signal transfer element and the photoelectric conversion element. Additionally, in such a case, a function, equivalent to the optical adjustment element, in which the photoelectric conversion portion is capable of controlling the intensity of entering and exiting light may be provided in the photoelectric conversion element side. Furthermore, also in a case where the optical adjustment element is not included in the optical window element, it is possible to configure a function equivalent to the optical adjustment element to be provided between the signal transfer element and the photoelectric conversion element.

Note that, as will be described later, a scheme configured to prevent the optical adjustment element 13 from being destroyed becomes necessary in a step of forming the aperture 6 in the sealing material 14.

The aperture 6 is a through hole in the sealing material 14 used for optical introduction into or deriving from the photoelectric conversion portion 1. Although any position in the sealing material 14 may be appropriate as a position of the aperture 6 as long as light can easily enter or exit the photoelectric conversion portion 1 therethrough, the most miniature optical device having a small number of parts can be realized by utilizing the back face of the substrate 10 as the optical window element as shown in FIG. 1A.

The optical device shown in FIG. 1A includes a connection terminal 3. The connection terminal 3 is electrically connected to the photoelectric conversion portion 1 through connection wiring 15, and is used for supplying an electric signal of the outside to the photoelectric conversion portion 1, or, for outputting to the outside an electric signal according to an intensity of incident light.

As shown in FIG. 1A, the most miniature optical device can be realized by using a flip-chip bonding method used in general. Here, it is desirable that: a lead frame be utilized for the connection terminal 3; and a metal bump, or a metal ball be utilized for the connection wiring 15. In this case, manufacturing of the optical device is facilitated as will be described later because the photoelectric conversion element 50 is fixed to the connection terminal 3 by the connection wiring 15 when being sealed.

While a connection method using the connection wiring 15 is shown in FIG. 1A, the photoelectric conversion element 50 is fixed to the connection terminal 3 as shown in FIG. 1B, and a metal wire may be used for connection wiring 16. A method using a metal wire is preferable because higher connection reliability can be obtained.

In FIG. 1B, the photoelectric conversion element 50 includes the photoelectric conversion portion 1 formed on the substrate 10, and the optical adjustment element 13, and is connected to the connection terminal 3 by the connection wiring 16. In this case, while the photoelectric conversion portion 1 and the connection wiring 16 are sealed by the sealing material 14 so as to be covered thereby, it is necessary that an aperture 7 be provided in the connection terminal 3 for derivation or introduction of light. In this case, a bottom face of the aperture 7, that is, an interface between the outside and the substrate 10 (the photoelectric conversion element 50) becomes the optical window, and the optical adjustment element 13 is formed on this optical window. Therefore, an interface between the optical adjustment element 13 and the outside becomes the optical window, and light is allowed to exit from or enter the photoelectric conversion portion 1 through the optical adjustment element 13 and a substrate 10. Note that the aperture 7 is a penetration hole patterned on the terminal 3.

In an optical device of FIG. 1B, the optical field of view can be changed as desired by varying the format of the aperture 7. Additionally, an external optical lens can be easily attached to the aperture 7. Likewise, in a structure as shown in FIG. 1C, a flip-chip bonding method using a metal bump or a metal ball as the connection wiring 15 may be employed. In this case, the most miniature optical device can be realized because a distance for connecting the metal wire to the connection terminal becomes shorter. The photoelectric conversion element 50 includes the photoelectric conversion portion 1 formed on the substrate 10, the optical adjustment element 13, and a later described reflection plate 9, and is connected to the connection terminal 3 by the connection wiring 15. In this case, although the photoelectric conversion element 50 is sealed so as to be covered by the sealing material 14 as in the case with FIG. 1B, a bottom face of the aperture 7, that is, an interface between the outside and the photoelectric conversion portion 1 becomes the optical window for derivation or introduction of light, and the optical adjustment element 13 is formed on this optical window. Therefore, an interface between the optical adjustment element 13 and the outside becomes the optical window, and light is allowed to exit or enter the photoelectric conversion portion 1 through the optical adjustment element 13.

As connection wiring, of the present invention, any one of wiring obtained by solidifying a paste of solder, metal or carbon, film wiring with a conductive material being dispersed thereon, and the like can be used, in addition to metal projections such as the above described metal ball and metal bump, or a metal wire. From the perspective of reliability of the connection wiring, metal projections such as a metal ball and a metal bump, or a metal wire is preferably used. To be precise, this is because these kinds of metal wiring have high reliability with manufacturing methods such as a flip-chip bonding method and a wire bonding method employed when these kinds of wiring are used. In Particular, these materials and these manufacturing methods using them are suitable because they are suitable for microfabrication, and can combine high reliability and productivity as metal wiring of a miniature optical device. Any one of a metal ball and a metal bump is more preferably used especially in terms of ability to miniaturize the optical device, whereas a metal wire is more preferable in terms of reliability of the connection wiring.

Figure 1D:
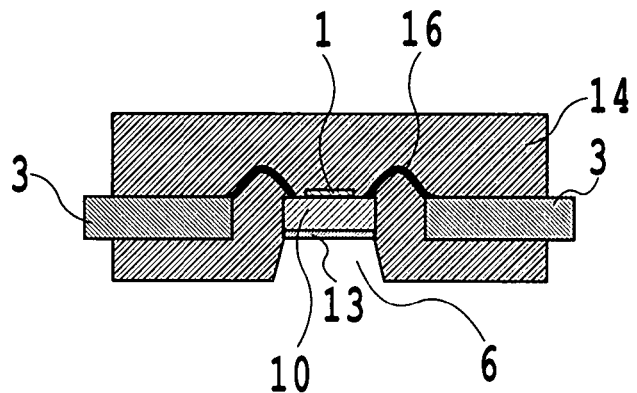
FIG. 1D is a cross-sectional view of an optical device according to the one embodiment of the present invention.

A structure shown in FIG. 1D may be adopted as needed to obtain a thinner optical device. Descriptions of the structure except for the shape of the connection terminal 3 will be omitted as the structure thereof is the same as that of FIG. 1B. A hole configured to contain the photoelectric conversion element 50 is formed in the connection terminal 3, and after the photoelectric conversion element 50 is placed in the hole, electrical connections are formed by metal wires provided as the connection wiring 16. In this case, the thinnest optical device can be realized.

Figure 1E:
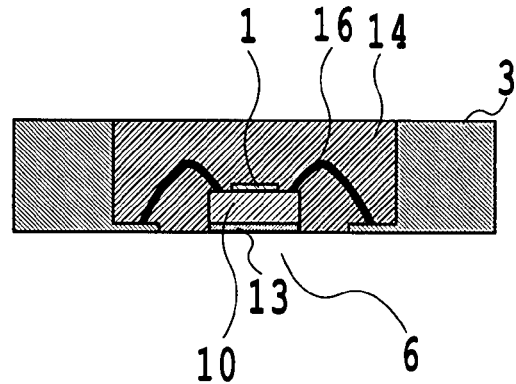
FIG. 1E is a cross-sectional view of an optical device according to the one embodiment of the present invention.

Furthermore, a structure shown in FIG. 1E may be adopted as needed. Descriptions of the structure except for the shape of the connection terminal 3 will be omitted as the structure thereof is the same as that of FIGS. 1B and 1D. While being allowed to be connected to the outside by being exposed to the same face as a face having the aperture 6 and to side faces thereof, the connection terminal 3 is additionally allowed to be connected to the outside by being exposed also to a face opposite to the face having the aperture 6. This case is favorable because, in this case, electrodes can be easily obtained also from the face opposite to the face having the aperture 6 in addition to the same face as the face having the aperture 6, and the side faces thereof. In each of the above described structures of FIGS. 1B and 1C, and in a later described structure having a signal transfer element, a connection terminal having the same shape as the shape in FIG. 1E can be similarly used in order to obtain electrical connection from a face opposite to a face having the aperture 6. Note that, with respect to a positional relation between the aperture 6 and the connection terminal, selection is made as appropriate in consideration of the usage of the present invention, size, easiness of manufacturing, and the like. Out of these configurations, in the case where the connection terminal 3 is located on the face opposite to the face having the aperture 6 is often preferable because designing can be facilitated, as the face through which light enters and exits and the face through which electrical connection is formed become opposite to each other. Furthermore, in the case of adopting such a structure where a face through which light enters and exits and a face through which electrical connection is formed can be set opposite to each other, the shape of the connection terminal can be designed, in order to enhance adhesion strength between the connection terminal and sealing resin. That is, the connection terminal is designed in such a manner that a step is provided in the connection terminal so as to prevent a part of the connection terminal (the part being located in one side of the optical device having a face through which light is inputted and outputted) from being exposed from the sealing resin.

The light reflection element 9 of the present invention is formed for the purpose of reflecting light. The role thereof is to increase photoelectric conversion efficiency. In the case of such an optical device as shown in FIG. 1C, the light reflection element 9 is formed on a opposite face of the substrate 10, with reference to the photoelectric conversion portion 1. When such an optical device is operated as an optical sensor, while a part of incident light is absorbed and converted into an electric signal by the photoelectric conversion portion 1, other part of the light passes through the photoelectric conversion portion 1, and is reflected to the photoelectric conversion portion 1 by the reflection plate 9, so that the photoelectric conversion portion 1 can absorb the reflected light again and convert it into an electric signal. Additionally, in a case where such an optical device is operated as a light emitting device, light having traveled to one side of the optical device opposite to the optical window is reflected by the reflection plate 9 to be emitted through the optical window, whereby light emission efficiency can be increased. In the structure shown in FIG. 1C, a metal film made of Al, Cr or the like having high reflectivity may be formed, by using an evaporation method, on a face of the substrate 10 on which the photoelectric conversion portion 1 is not formed. Although a shielding plate may be formed instead of the reflection plate 9, it is desirable that a material having both effects of light reflection and electromagnetic noise absorption be used as needed. As a material thus simultaneously fulfilling the role of light reflection and electromagnetic noise absorption, metal materials such as Fe, Cr, Ni and the like can be exemplified, and these metal materials are used by being laminated as needed. The shielding plate of the present invention designates a plate which absorbs electromagnetic noise. Particularly in the case of an optical sensor which detects a weak signal, the shielding plate has an effect of improving an S/N ratio of the sensor by absorbing outer electromagnetic noise.

(Regarding a Signal Processing Circuit, a Driver Circuit, and an Interposer)

Next, optical devices each including a signal transfer element will be described by using FIGS. 1F to 1I. The signal transfer element is a signal processing circuit, an element including a driver circuit, or an interposer.

Hereinbelow, description will be given by often using a "signal processing circuit 2" as the signal transfer element. In this case, the signal processing circuit 2 is a signal processing circuit, an element including a driver circuit, or an interposer.

Figure 1F:
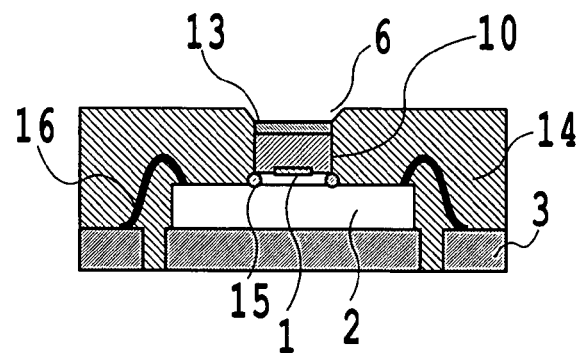
FIG. 1F is a cross-sectional view of an optical device according to the one embodiment of the present invention.

FIG. 1F is a cross-sectional view of an optical device according to the one embodiment of the present invention. Here, since FIG. 1F is substantially the same as the structure shown in FIG. 1A except for the later described signal processing circuit 2 and the connection wiring 16, description thereof will be omitted as appropriate.

As the signal processing circuit 2 is generally formed as a circuit of a semiconductor element on a silicon substrate, the photoelectric conversion portion is often formed on a substrate different from a substrate for the signal processing circuit 2. Note that, as has been described above, the photoelectric conversion portion 1 is only required to receive or emit light having predetermined wavelengths (wavelength range), for example, in the infrared region or in the ultraviolet region, and may be selected in accordance with a design of the optical device. For example, in a case where the optical device is designed as an infrared sensor, a quantum type infrared photoelectric conversion portion capable of operating at a room temperature or the like may be adopted as the photoelectric conversion portion.

In the case of an optical sensor, the signal processing circuit 2 performs amplification or the like of a weak signal from the photoelectric conversion portion 1, and outputs the signal as an analogue signal or a digital signal after comparing the amplified signal with a reference value. In an optical device not requiring a signal processing circuit, an interposer used for routing of wiring may be used as the signal transfer element (as the signal processing circuit 2 in the drawing). The substrate 10 is fixed onto the signal processing circuit 2 by using a flip-chip bonding method, and is electrically connected to the signal processing circuit 2 by a metal bump (a metal ball) used as the connection wiring 15. Additionally, in the case of a light emitting device which emits light, a driver circuit which supplies a power source to the photoelectric conversion portion 1 may be utilized instead of the signal processing circuit 2.

The connection terminal 3 is used to allow electrical connection of the signal processing circuit 2 (the interposer, the signal processing circuit, or the driver circuit) with the outside even in the case of an optical device requiring any one of: the interposer as means for facilitating electrical connection between the photoelectric conversion portion 1 and the connection terminal 3; the signal processing circuit as means for processing an output from the photoelectric conversion portion 1; and the driver circuit as means for driving an electric signal inputted to the photoelectric conversion portion 1. That is, as shown in FIG. 1F, the signal processing circuit 2 is formed on at least a part of the connection terminal 3, the connection terminal 3 is electrically connected through the connection wiring 16 to the signal processing circuit 2 in a part of a region of the connection terminal 3 where the signal processing circuit 2 is not formed, and the photoelectric conversion element 50 is electrically connected to the outside through the signal processing circuit 2 by such a structure. Particularly in the case of the photoelectric conversion portion 1 of an optical sensor generating a weak output signal, a structure using the connection wiring 15 in particular is a desirable structure because connection wiring thereof with an amplification circuit (unillustrated) in the signal processing circuit 2 becomes the shortest, and the photoelectric conversion portion 1 thereby becomes less susceptible to electromagnetic noise from the outside.

Note that, in the present invention, the signal processing circuit 2 provided as the signal transfer element maybe, for example, an interposer, a signal processing circuit, a driver circuit or the like as long as it is configured to perform processing on a signal, and may be one obtained by combining an interposer, a signal processing circuit and a driver circuit. That is, the signal processing circuit 2 can be at least any one of an interposer, a signal processing circuit and a driver circuit.

Figure 1G:
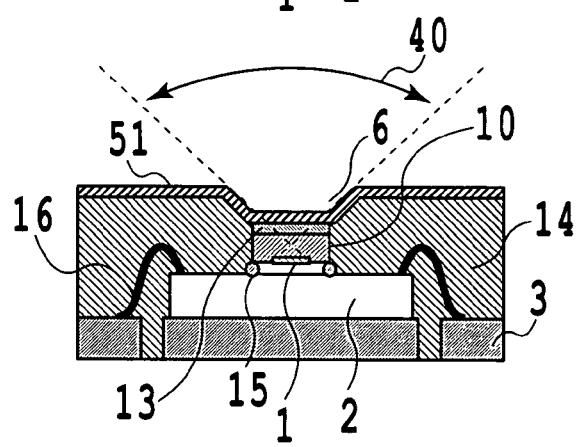
FIG. 1G is a cross-sectional view of an optical device according to the one embodiment of the present invention.

The sealing material 14 is used so as to protect the signal processing circuit 2, the substrate 10 and the lead frame 3. That is, the sealing material is a member which performs sealing so as to protect the photoelectric conversion portion 1. For the sealing material 14, a material of any kind can be adopted as long as the material is one used for a mold. As a specific example, a sealing resin such as one of thermosetting resins represented by epoxy resins used for packages of semiconductor devices can be cited. Molding of the sealing material 14 is performed after fixing the substrate 10 and the signal processing circuit 2 onto the connection terminal 3. Additionally, after the sealing material 14 is molded, the aperture 6 is formed, for example, by using sandblast etching as will be described later. By thus forming the aperture 6 and forming an exposed face, the substrate 10 comes to be exposed, and the optical window is provided. Therefore, an interface between the substrate 10 and the outside comes to also function as a optical window. This aperture 6 is formed so that an entirety of the back face of the substrate 10 can be exposed. Although the aperture 6 is formed in FIG. 1F so that an entirety of the back face of the substrate 10 can be exposed, the aperture 6 is not limited to this, and may be formed so that at least a part of the back face of the substrate 10 can be exposed. That is, it is only necessary to set at least a part of the back face of the substrate 10 as the optical window. As shown in FIG. 1G, in order to adjust a sensitive range of light, the aperture 6 can be changed, depending on conditions of sandblast etching, so as to have a desired optical field of view 40. That is, the optical field of view 40 can be adjusted by adjusting an area of an exposed surface of the substrate 10, the depth of the etching, and the angle of the step height between the exposed surface and an upper face of the sealing material 14.

Additionally, while an area and a shape of the aperture 6 can be freely designed, a higher mechanical strength can be obtained if they are designed so that a part of a face of the photoelectric conversion element 50 in one side thereof having the optical window can be unexposed and covered by the sealing material. Additionally, a desired optical field of view of the optical sensor can be obtained depending on the shape of the aperture.

Figure 1H:
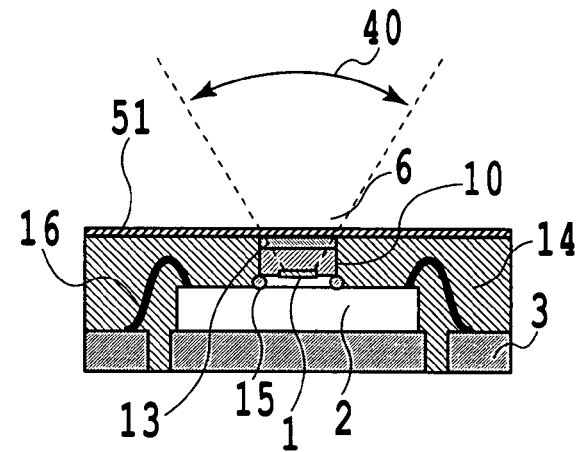
FIG. 1H is a cross-sectional view of an optical device according to the one embodiment of the present invention.

While formation of the aperture as shown in each of FIGS. 1F and 1G requires etching of a part of the sealing material 14, the formation may be performed by non-selective etching an entirety of the sealing material 14, not by selectively forming the aperture 6 as shown in FIG. 1H. By thus forming the aperture, a sandblast-etching step can be simplified. Here, the optical field of view 40 is determined by the thickness of the substrate 10, and the area of the photoelectric conversion portion 1. Here, because FIG. 1H is substantially the same as the structure shown in FIG. 1F except for the shape of a surface of the sealing material 14 and a later described protective layer 51, description thereof is omitted.

Figure 1I:
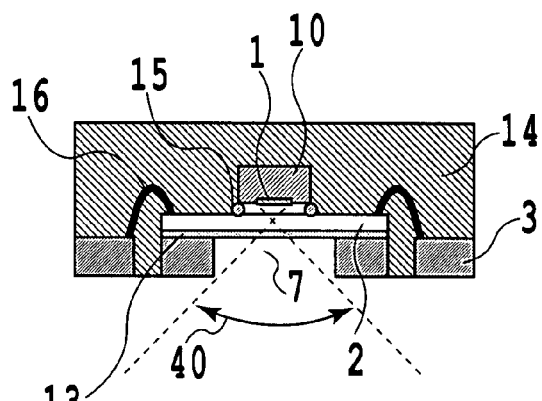
FIG. 1I is a cross-sectional view of an optical device according to the one embodiment of the present invention.

Additionally, as shown in FIG. 1I, light may be allowed to be inputted to or outputted from the signal processing circuit 2. Here, the substrate for the signal processing circuit 2 is utilized as the optical window. Here, description of FIG. 1I will be omitted as appropriate because it is substantially the same as the structure shown in FIG. 1F except that the signal processing circuit 2 is formed into the optical window, and except for a shape of the connection terminal 3 and a position of the optical adjustment element 13. In this case, because the photoelectric conversion portion 1, the signal processing circuit 2, the connection wiring 16 and the like are sealed by the sealing material 14 so as to be covered thereby, it is necessary that the aperture 7 be provided in the connection terminal 3. Here, the optical field of view 40 of the sensor can be changed into a desired optical field of view by changing an area of the aperture 7 in the connection terminal 3. Note that, in a case where the signal processing circuit 2 is set to work also as the optical window as shown in FIG. 1I, the signal processing circuit 2 is formed of a material transmitting, with high transmittance, light having a wavelength received or emitted by the photoelectric conversion portion 1. In the case of a device shown in FIG. 1I, an interface between the signal processing circuit 2 and the outside becomes the optical window. As has been described above, in a case where neither the signal processing circuit 2 nor an interposer is provided, an interface between the substrate 1 and the outside becomes the optical window as shown in FIG. 1B. Alternatively, as shown in FIG. 1C, an interface between the photoelectric conversion portion 1 and the outside may become the optical window. Note that, as shown in the drawings, in each of these cases, the optical adjustment element 13 can be provided on the interface with the outside. For example, as shown in FIG. 1I, the optical adjustment element 13 is formed on the signal transfer element (the signal processing circuit 2), and the optical window is formed on a face of the optical adjustment 13 which meets the outside.

The cases each having a structure where the photoelectric conversion element and the signal transfer element (the signal processing circuit 2) are laminated have been described hereinabove by using FIGS. 1F to 1I. In a case having such a lamination structure, miniaturization of an optical device can be achieved because a plurality of elements are stacked.

Figure 7:
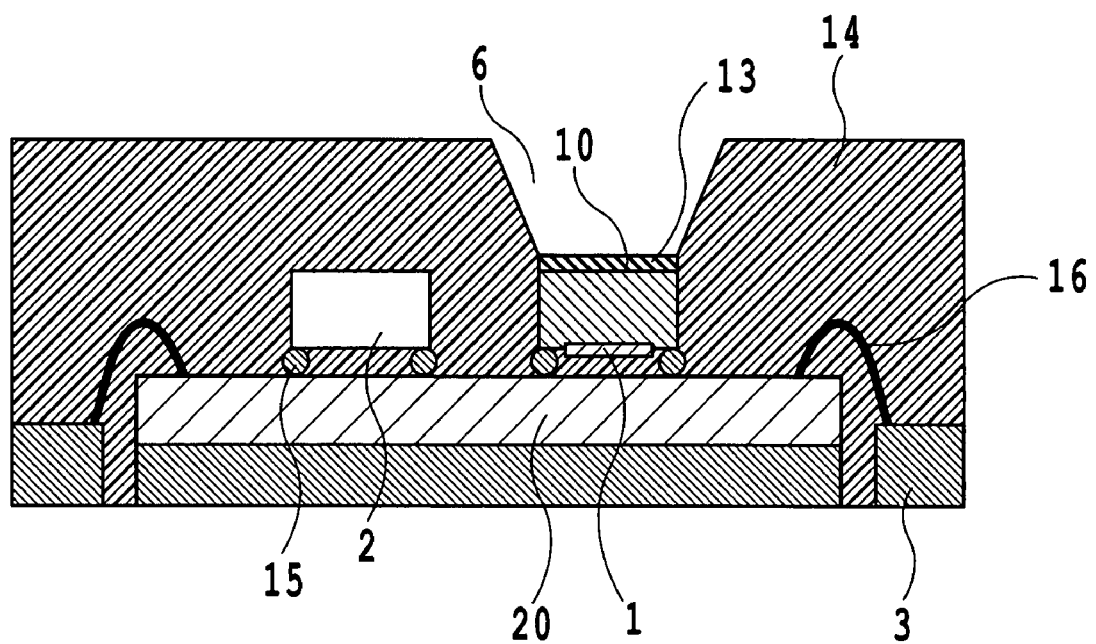
FIG. 7 is a cross-sectional view in a case where an interposer according to the one embodiment of the present invention is used.

Another structure is a structure where the photoelectric conversion element and the signal transfer element (the signal processing circuit 2) are placed side by side as shown in FIG. 7. In FIG. 7, unlike in structures shown in FIGS. 1I and 5B, the photoelectric conversion element 50 including the substrate 10, the photoelectric conversion portion 1 and the optical adjustment element 13, and the signal processing circuit 2 provided as the signal transfer element are each fixed onto different locations on an interposer 20 through the connection wiring 15. In addition, the wiring on the interposer 20 electrically connects the photoelectric conversion portion 1 to the signal processing circuit 2. For example, in the case of an infrared sensor, this structure is an effective structure because it enables the photoelectric conversion portion to be unaffected by heat generation of the signal processing circuit, or to be less unaffected thereby. That is, because the photoelectric conversion portion 1 and the signal processing circuit 2 may be placed on any locations as long as they are on the interposer 20, it becomes possible to place the photoelectric conversion portion 1 and the signal processing circuit 2 in locations where they do not affect (are less likely to affect) each other in terms of heat. Additionally, using the structure described in connection with FIG. 7 is effective in a case where the signal transfer element has an area smaller than that of the photoelectric conversion element. In such a structure where the photoelectric conversion element and the signal transfer element are placed side by side, while they may be placed side by side on a single substrate as shown in FIG. 7, it is also possible to cover each element with a single sealing material, and form the optical window on a part of the photoelectric conversion element. In such a case, the photoelectric conversion element can assume any one of structures as shown in FIGS. 1A to 1J, and it is only necessary to place the signal transfer element in the sealing material in accordance with each structure, and connect them through connection wiring represented by a metal wire as needed. For example, in a case where the photoelectric conversion element assumes the structure of FIG. 1E, the signal transfer element is placed so as to be side by side with the photoelectric conversion element, then is sealed by the sealing material, and is connected to the photoelectric conversion element and the connection terminal through a metal wire. By configuring the structure in this way, it becomes possible to connect the signal transfer element, especially the signal transfer element including the signal processing circuit or the driver circuit, and the photoelectric conversion element to each other by using only a metal wire with which more highly reliable electrical connection is easily achieved.

(Regarding a Protective Film and a Reflection Plate)

Figure 1J:
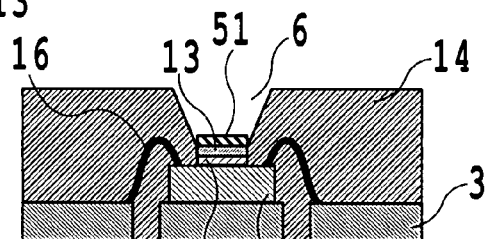
FIG. 1J is a cross-sectional view of an optical device according to the one embodiment of the present invention.
Figure 1K:
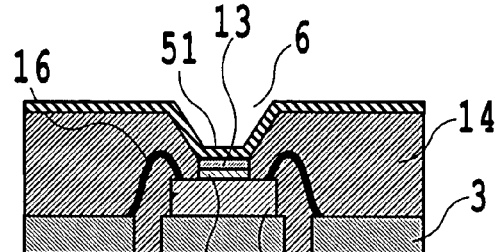
FIG. 1K is a cross-sectional view of an optical device according to the one embodiment of the present invention.
Figure 1L:
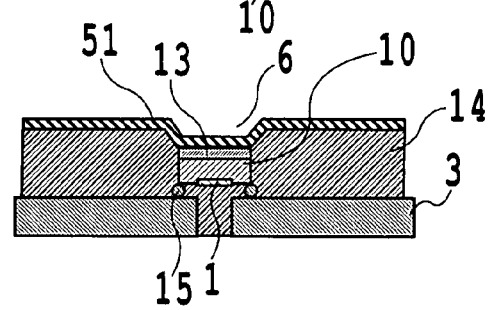
FIG. 1L is a cross-sectional view of an optical device according to the one embodiment of the present invention.

Additionally, as shown in FIGS. 1J to 1L, after forming the aperture 6 as will be described later, the optical adjustment element 13 formed on the photoelectric conversion element 50 may be provided with the protective layer 51, having a function of protecting deterioration likely to occur by making contact with external air.

In FIG. 1J, the protective layer 51 is formed so as to protect only the optical adjustment element 13. The photoelectric conversion element 50 includes the photoelectric conversion portion 1 and the optical adjustment element 13 which are formed on the substrate 10, and is connected to the connection terminal 3 by the connection wiring 16. The photoelectric conversion element 50 is sealed by the sealing material 14, and the aperture 6 is formed in the sealing material 14 for derivation or introduction of light. In this case, an interface between the outside and the photoelectric conversion portion 1 becomes the optical window, and the optical adjustment element 13 is formed in the optical window. Furthermore, the protective layer 51 is formed on the optical adjustment element 13. Therefore, light is allowed by the photoelectric conversion element 1 to exit or enter through the protective layer 51 and the optical adjustment element 13.

Alternatively, as shown in FIGS. 1K and 1L, the protective layer 51 may be formed so as to protect a part or an entirety of the sealing material 14. In each of these cases, the aperture 6 and the sealing material 14 can be protected and a more highly reliable optical device can be realized. Here, because FIG. 1K is substantially the same as the structure shown in FIG. 1J except for the range protected by the protective layer 51, description thereof will be omitted as appropriate. Additionally, because FIG. 1L is substantially the same as the structure shown in FIG. 1A except for the protective layer 51, description thereof will be omitted as appropriate.

Furthermore, as shown in FIGS. 1G and 1H, the protective layer 51 may be formed so as to protect a part or an entirety of the sealing material 14.

Figure 1M:
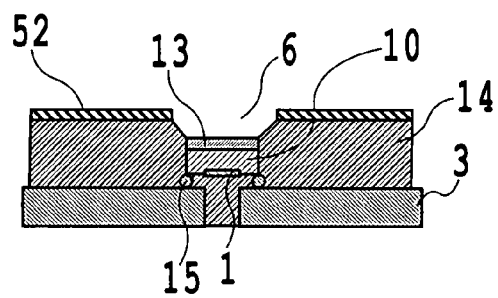
FIG. 1M is a cross-sectional view of the optical device according to the one embodiment of the present invention.

Additionally, a reflection plate 52 maybe provided as in FIG. 1M. Particularly in the case of a long-wavelength infrared sensor, because the photoelectric conversion portion 1 is susceptible to heat, heat generation attributable to absorption of incident light by the sealing material 14 is prevented or reduced by providing the reflection plate 52, whereby response speed can be improved. Therefore, it is preferable to form the reflection plate 52 on the sealing material 14. Here, because FIG. 1M is substantially the same as the structure shown in FIG. 1A except for the reflection plate 52, description thereof is omitted as appropriate.

Note that the protective layer 51 and the reflection plate 52 can be formed into predetermined shapes by utilizing a photolithography technique.

(Regarding a Configuration of the Signal Processing Circuit)

Next, a configuration of the signal processing circuit 2 will be described.

Figure 2:
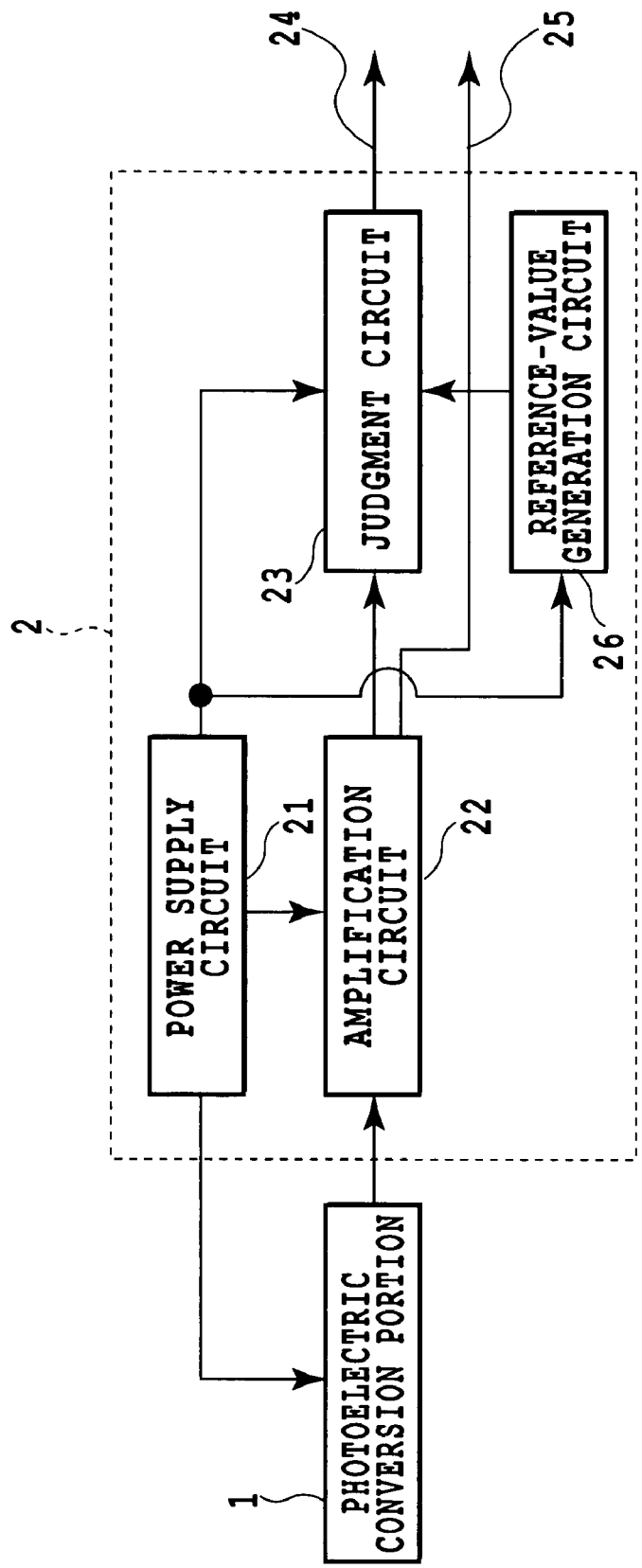
FIG. 2 is an explanatory diagram of the structure of a signal processing circuit according to the one embodiment of the present invention.

As shown in FIG. 2, the signal processing circuit 2 includes: a power supply circuit 21 which supplies a bias current or voltage to the photoelectric conversion portion 1 and each of other circuits as appropriate; an amplification circuit 22 which amplifies a signal outputted from the photoelectric conversion portion 1; a judgment circuit 23 which compares the amplified signal with a preset voltage; and a reference-value generation circuit 26 which inputs the preset voltage to the judgment circuit 23 as a reference value, and the judgment circuit 23 externally outputs a digital output 24 which is a digital output signal as a judgment result. Each of elements included in the signal processing circuit 2 is electrically connected to a corresponding element.

Because the amplitude or the amount of variation, of the output signal of the photoelectric conversion portion 1 is generally as small as several μV to not more than several mV, an electric signal is amplified by the amplification circuit 22 of the signal processing circuit 2. Therefore, when light enters the photoelectric conversion portion 1, the incident light is converted into an incident electric signal, and then is outputted to the amplification circuit 22. The amplification circuit 22 amplifies and then outputs the incident electric signal.

Thereafter, although the incident electric signal having been amplified by the amplification circuit 22 may be extracted to the outside of the signal processing circuit 2 by way of an analogue output 25 directly in the form of an analogue signal, this incident electric signal is inputted to the judgment circuit 23 for judging whether or not an infrared light from a human body or flames has been sensed. At this time, while a voltage (a reference-value voltage) having been set in accordance with light having a wavelength and intensity that should be judged by the judgment circuit 23, has been inputted in the judgment circuit 23 by the reference-value generation circuit 26, the judgment circuit 23 compares the reference-value voltage and the amplified incident electric signal with each other. Specifically, the light having a wavelength and intensity that satisfied the judgment level generated by the reference-value generation circuit 24 will generate a digital signal in the digital output 24 which indicates the above light was detected. Hence, the judgment circuit externally outputs a digital electrical signal, which is a result of the comparison done by the judgment circuit 23.

Note that the voltage (the reference-value voltage) generated by the reference-value generation circuit 26 is not limited to the above described one, and may be set as desired in accordance with light having a wavelength received by the photoelectric conversion portion 1. For example, if light received by the photoelectric conversion portion 1 is light in the ultraviolet region, the reference-value voltage may be set in accordance therewith.

Additionally, in the judgment circuit 23, judgment thereby is not limited to judgment on whether or not incident light (detected light) is light within a predetermined range, and a scheme may be adopted which is to cause the judgment circuit 23 to generate an electric signal of not less than a specific magnitude, depending on whether or not an amount of light (for example, infrared light or the like) having entered the photoelectric conversion portion 1 has become not less than a given amount. A voltage equivalent to this given amount is outputted by the reference-value generation circuit 26.

Although it is preferable, in terms of mass-productivity, designing flexibility and the like, that the signal processing circuit 2 be formed on a most commonly used silicon substrate by a CMOS process, a BiCMOS process, a bipolar process or the like, the signal processing circuit 2 may be formed on any one of compound semiconductor substrates including a GaAs substrate, and the most appropriate material and process can be selected in accordance with the purpose of use, use environment and the like.

Furthermore, in the case of using the signal processing circuit 2, because connection between the photoelectric conversion portion 1 and the signal processing circuit 2 is formed by the connection wiring 15 as shown in FIGS. 1F to 1I, an air gap can be easily formed between the photoelectric conversion portion 1 and the signal processing circuit 2. In such a case, a suitable optical device can be obtained also in a case where the photoelectric conversion portion 1 is a heat type photoelectric conversion portion such as that of the above described pyroelectric type or thermoplie type. Furthermore, in the case of a heat type photoelectric conversion portion, after the photoelectric conversion portion is formed on the substrate, the photoelectric conversion element may be used by configuring air gaps to be formed to both faces of the photoelectric conversion portion by selectively etching a face of the substrate which makes contact with the photoelectric conversion portion.

Next, details of an electromagnetic shielding/reflection plate 4 as shown in FIG. 3A will be described. In FIG. 3A, the electromagnetic shielding/reflection plate 4 is configured to have at least any one of functions of electromagnetic shielding and light reflection. Here, because FIG. 3A is substantially the same as the structure shown in FIG. 1G, description thereof will be omitted as appropriate.

The electromagnetic shielding/reflection plate 4 is formed for the purpose of shielding electromagnetic noise in a low frequency range which is important in the optical device of the present invention. That is, it is important to reduce influence of electromagnetic noise, and therefore the electromagnetic shielding/reflection plate 4 is provided on at least a part of a face of the signal processing circuit 2 in the front face side thereof so as to reduce influence of electromagnetic noise. In the present invention, because the electromagnetic shielding/reflection plate 4 can be thus formed in the vicinity of a part of the photoelectric conversion portion 1 or the signal processing circuit 2 which is desired to be shielded against electromagnetic noise, an optical device can be realized that is: capable to easily be shielded from electromagnetic noise; tolerable against electromagnetic noise outside of a sensor as a result; and is highly sensitive. As a material of the electromagnetic shielding plate, an alternative from a broad range of materials can be considered in accordance with the purpose of use. For example, in an infrared sensor which is a light receiving element intended for the infrared region having suitable sensitivity wavelengths of the optical device of the present invention, a material having a high magnetic permeability, the material being excellent in a shielding characteristic against electromagnetic waves in low wavelengths of several Hz to about 100 kHz which become particularly important therein. It is also possible to use a material such as: a magnetic metal thin film made of iron, nickel or the like; ferrite; or permalloy.

Additionally, in terms of the light reflection function, a metal material having high reflectivity for an intended wavelength is suitably used, and, in the case of a light receiving or light emitting element intended for the infrared region having sensitivity wavelengths that are suitable to the optical device of the present invention, metal such as aluminum or chrome is suitably used in view of high reflectivity, and easiness of placement. Thus, a metal material is often suitably used for the electromagnetic shielding/reflection plate 4, and these materials can be used in combination by laminating according to the need, for example.

Additionally, as in FIG. 3A, the electromagnetic shielding/reflection plate 4 may be formed in the front face side of the signal processing circuit 2. In this case, the electromagnetic shielding/reflection plate 4 can function as an electromagnetic shielding plate. Additionally, in a case where the electromagnetic shielding/reflection plate 4 is formed in the front face side of the photoelectric conversion portion 1, it not only functions as an electromagnetic shielding plate but also is allowed to function as a later described reflection plate, and is used in accordance with need. While a connection terminal that is a seating of the signal processing circuit 2 is used for making electrical connection to the outside, the connection terminal 3, itself may be utilized as the electromagnetic shielding/reflection plate.

Here, in the present description, the front face side of the signal processing circuit 2 designates one side thereof in which a signal processing circuit, a driver circuit, or a signal transfer circuit such as wiring is provided.

In a case where the optical window of the device is the signal processing circuit 2 as shown in FIG. 1I, the connection terminal 3 is enabled to have the electromagnetic shielding function, and functions of the connection terminal 3 come to have three functions which are: electrical connection with the outside; electromagnetic shielding; and optical field of view adjustment of the aperture 6. Therefore, the above described configuration, where the same element (for example, the connection terminal 3) is used with various functions, becomes very efficient, and a simplified package can be realized.

In accordance with need, the output from the photoelectric conversion element 1 may be outwardly taken out without having been electrically processed. In this case, as the signal transfer element (the signal processing circuit 2 in the drawing), an interposer may be used for routing of wiring. As a material for the interposer, a material having high transmittance in desired sensitive wavelengths is desirable. Additionally, as shown in FIGS. 1A to 1D and 1J to 1M, the substrate 10 on which the photoelectric conversion portion 1 has been formed may be fixed directly on the connection terminal 3.

Next, the reflection plate 9 formed for increasing light absorption efficiency in the photoelectric conversion portion will be described in detail by using FIG. 3B. Here, because FIG. 3B is substantially the same except for the reflection plate 9, description thereof will be omitted as appropriate.

Particularly in the case of an infrared sensor, infrared light having long wavelengths often result in poor absorption efficiencies (external quantum efficiencies) in the photoelectric conversion portion. For this reason, the reflection plate may be used for increasing external quantum efficiency in accordance with need. While several alternative structures can be considered also for an infrared reflection film depending on cases, the electromagnetic shielding/reflection plate 4 utilized also as electromagnetic shielding may be utilized as the light reflection plate as shown in FIG. 3A. Here, while a light beam having entered from above in FIG. 3A is detected by the photoelectric conversion portion 1 through the substrate 10, light having not been absorbed is reflected by the electromagnetic shielding/reflection plate 4, and is again detected by the photoelectric conversion portion 1, whereby external quantum efficiency can be increased.

Alternatively, in a case where, as shown in FIG. 3B, the aperture 7 used for light entrance is provided on a face of the signal processing circuit 2 on which the connection terminal 3 has been formed, the reflection plate 9 is provided on the back face of the substrate 10. In the case of FIG. 3B, a portion of the light (for example, infrared light) having entered from below through the signal processing circuit 2, permeate the photoelectric conversion portion 1 without being absorbed by the photoelectric conversion portion 1. However, this not absorbed light portion is reflected by the reflection plate 9, and returns to be detected again by the photoelectric conversion portion 1. This process increases the external quantum efficiency of the photoelectric conversion portion 1. That is, in FIG. 3B showing a case having the reflection plate 9, and having the optical window formed in the connection terminal 3 side, the reflection plate 9 is formed on a face of the substrate 10 which is opposite to a face thereof formed by the photoelectric conversion portion 1. In the case of a light emitting device, light emitted from the photoelectric conversion portion 1 which then travels to a side opposite to the optical window, is reflected by the reflection plate 9, whereby light emitting efficiency to the optical window e can be increased. In the case of an optical sensor, while a part of light having entered from the optical window element is absorbed by the photoelectric conversion portion 1 and is converted into an electric signal, light having not been absorbed is reflected by the reflection plate 9 to the photoelectric conversion portion 1, whereby detection sensitivity can be increased.

As a material for the reflection plate 9 shown in FIG. 3B, any material maybe used as long as the material reflects light. Additionally, because increasing on the external quantum efficiency in the photoelectric conversion portion 1 is important by providing the reflection plate 9, the reflection plate 9 may be provided on at least a part of the back face of the substrate 10. The electromagnetic shielding/reflection plate 4 shown in FIG. 3A may be provided only with the light reflection function. In a case where the reflection plate 9 is formed on a silicon substrate, if metal such as aluminum or copper used as a wiring material thereof is formed by another compound semiconductor process, it is most preferable that a gold wiring layer which is a wiring material be used.

(Regarding a Lens)

Figure 4A:
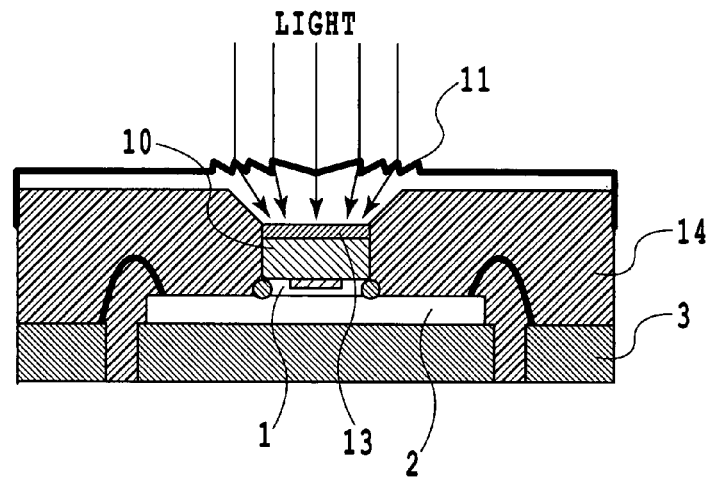
FIG. 4A is a cross-sectional view of an optical device in the case of using a condenser lens according to the one embodiment of the present invention.
Figure 4B:
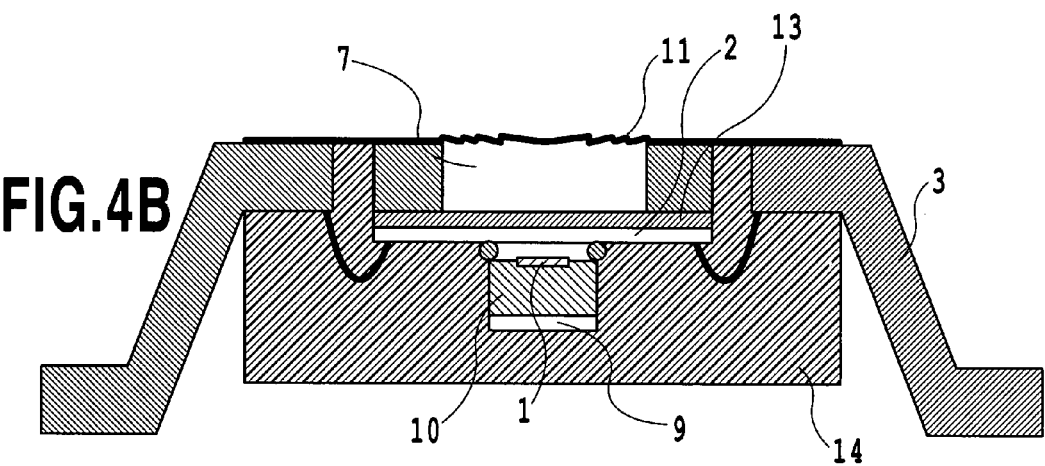
FIG. 4B is a cross-sectional view of an optical device in the case of using a condenser lens according to the one embodiment of the present invention.
Figure 4C:
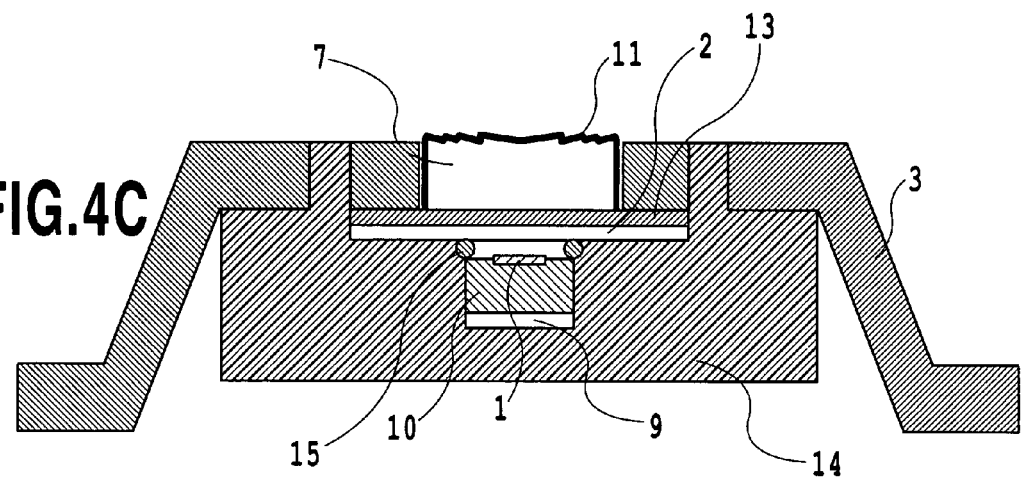
FIG. 4C is a cross-sectional view of an optical device in the case of using a condenser lens according to one embodiment of the present invention.

In a case where an optical device is designed to operate as an optical sensor, in order to increase external quantum efficiency or else to limit the optical field of view, the light to be detected could be condensed by the use of lens. In this case, the lens 11 could be used to cover the above described optical adjustment portion, or independently to cover at least a part of the aperture. Likewise, in a light emitting device, a condensing lens may be utilized, for example, in a case where emitted light is desired to be condensed in the form of a spot. In a case where the optical device of the present invention receives or emits light in the infrared region, any one of semiconductor materials such as silicon and germanium, and macromolecular materials represented by polyolefins such as polyethylene and cyclic polyolefin is mainly used as a material that efficiently transmits light having long wavelengths. Such a material is selected as appropriate depending on a wavelength used therein and an environment. For example, in a case where a macromolecular material cannot tolerate a high temperature at the time of soldering reflow or soldering in packaging the optical device of the present invention, the most appropriate usage is to attach the lens 11 so as to be overlaid on the optical device, after the packaging using solder is completed. Entire views of optical devices in this case are shown in FIGS. 4A to 4C. Here, because FIG. 4A is substantially the same as the structure shown in FIG. 1F except for the lens 11, description thereof will be omitted as appropriate. Additionally, because each of FIGS. 4B and 4C is substantially the same as the structure shown in FIG. 3B except for the lens 11 and the shape of the connection terminal 3, description thereof will be omitted as appropriate.

FIG. 4A is a case where the optical window is provided to the substrate 10 side of the photoelectric conversion portion 1. Each of FIGS. 4B and 4C is a case where the optical window is provided on the signal processing circuit 2 side.

In the case of FIG. 4A, the lens 11 is used so as to cover an entirety of the aperture.

In the case of FIG. 4B, while the thin-film Fresnel lens 11 is formed on a face of the signal processing circuit 2 (a face opposite to the face where the substrate 10 and the photoelectric conversion portion 1 is formed) on which the connection terminal 3 (a lead frame) is formed, it is necessary that the connection terminal 3 be routed to a side opposite to the side having the lens 11. In the case of an infrared sensor, as a material of the lens, it is possible to use one obtained by forming, into a film, a thin-filmed heat-resistant high polymer material such as an epoxy resin or polyimide which is lower in transmission property for infrared light than polyethylene but capable of enduring a high temperature at the time of soldering.

In the case of FIG. 4C, the lens 11 is attached to the connection terminal 3 by utilizing the aperture 7 of the connection terminal 3. Alternatively, depending on the case, the same effect can be obtained by setting a substrate for the signal processing circuit 2 as the optical adjustment element, and processing the substrate so as to be shaped into a lens. Note that the shape and material of the lens, and the entering or exiting direction of light can be designed in combination as appropriate in consideration of the purpose and easiness of production.

In the above description, although description has been given based on a structure where, after each of the photoelectric element 1 and the signal processing circuit 2 is formed on separate substrates, electrical connection is formed, they may be formed on the same substrate according to need. If the photoelectric element 1 and the signal processing circuit 2 are formed on the same substrate, it becomes unnecessary to use a flip-chip bonding method, a wire-bonding method or the like for electrical connection between the photoelectric element 1 and the signal processing circuit 2, whereby: reliability of an optical device is further enhanced; and the number of manufacturing steps is reduced. It is preferable that the photoelectric conversion element 1 be one that can be manufactured based on a regular silicon process, and any one of various methods (a quantum type, a heat type or the like), and any one of various configurations can be adopted as has been described so far.

Next, the various configurations of the optical device in the present invention will be described by using an example of a case where the optical device is an infrared sensor. The present invention is characterized in that a very miniature optical device having a simple structure can be realized without particularly providing any optical window, and moreover by integrating the signal processing circuit with other elements, the optical window having been general in conventional infrared sensors for long wavelengths including a pyroelectric sensor, and being placed with a space interposed between a sensor element and the optical window. This is because, by setting the optical window as a part of on of the elements (the sealing material or the connection terminal) in one side of the optical device through which light enters, a part of the photoelectric conversion element, the signal transfer element or the like is exposed from the optical window. A number of structural variations can be considered for the implement of this configuration. Unlike the conventional light receiving element for infrared light having short wavelengths, there is no suitable sealing material that efficiently transmits infrared light. For this reason, as a substrate for the photoelectric conversion portion, a substrate with high transmissivity at the infrared regions is used.

(Regarding a Light-Blocking Layer)

Figure 5A:
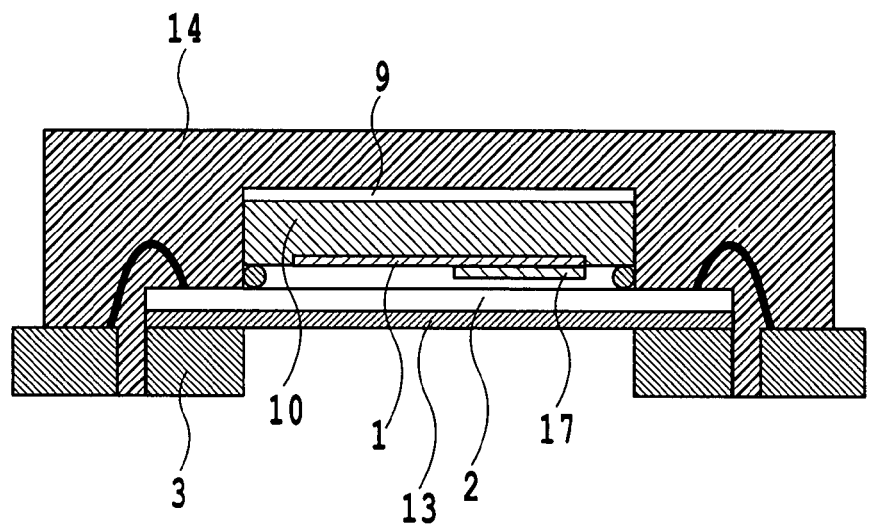
FIG. 5A is a cross-sectional view of an optical device in which partial irradiance is utilized, according to the one embodiment of the present invention.
Figure 5B:
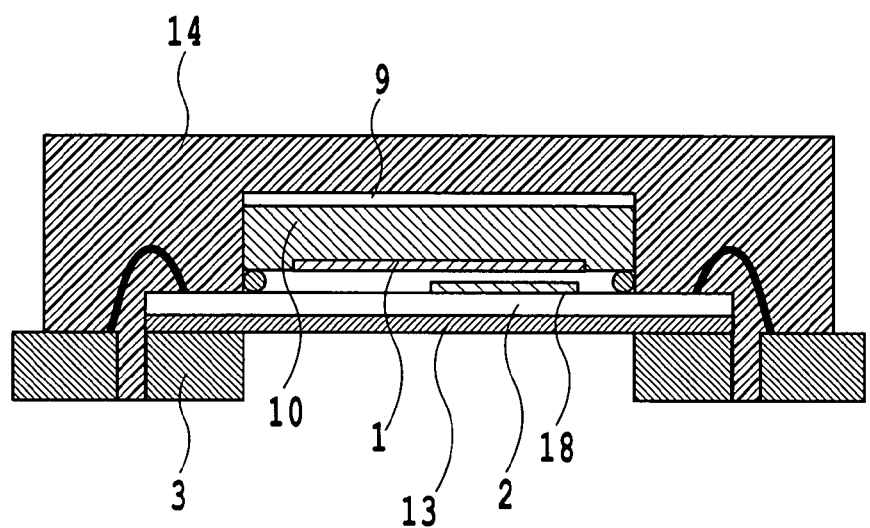
FIG. 5B is a cross-sectional view of an optical device in which partial irradiance is utilized, according to the one embodiment of the present invention.

Firstly, in the case of a structure by which infrared light having permeated the substrate of the signal processing circuit 2 is detected, methods of performing joining with the photoelectric conversion portion 1 are broadly divided into two kinds. One of them is to perform the joining in a state where the front face side of the photoelectric conversion portion 1 (a face opposite to a face joined to the substrate 1) and the front face side of the signal processing circuit 2 face each other, and becomes, for example, as shown in FIG. 1I. In this structure, in a case where there arises a need to block a part of a light receiving face of the photoelectric conversion portion 1 against light, a light-blocking layer 17 may be provided in an uppermost layer of the photoelectric conversion portion 1 as shown in FIG. 5A, it is also possible to provide a light-blocking layer 18 in the signal processing circuit 2 side as shown in FIG. 5B. By thus providing the light-blocking layer 18, more space can be formed between the photoelectric conversion portion 1 and the light-blocking layer than in the case of forming the light-blocking layer in the photoelectric conversion portion 1 side. Thus, heat becomes less likely to be transmitted from the light-blocking layer to the photoelectric conversion portion. For this reason, this configuration is favorable in some cases because a temperature change of the light receiving face of the photoelectric conversion portion is less likely to occur.

(Regarding a Case having a Plurality of Photoelectric Conversion Elements)

Figure 6:
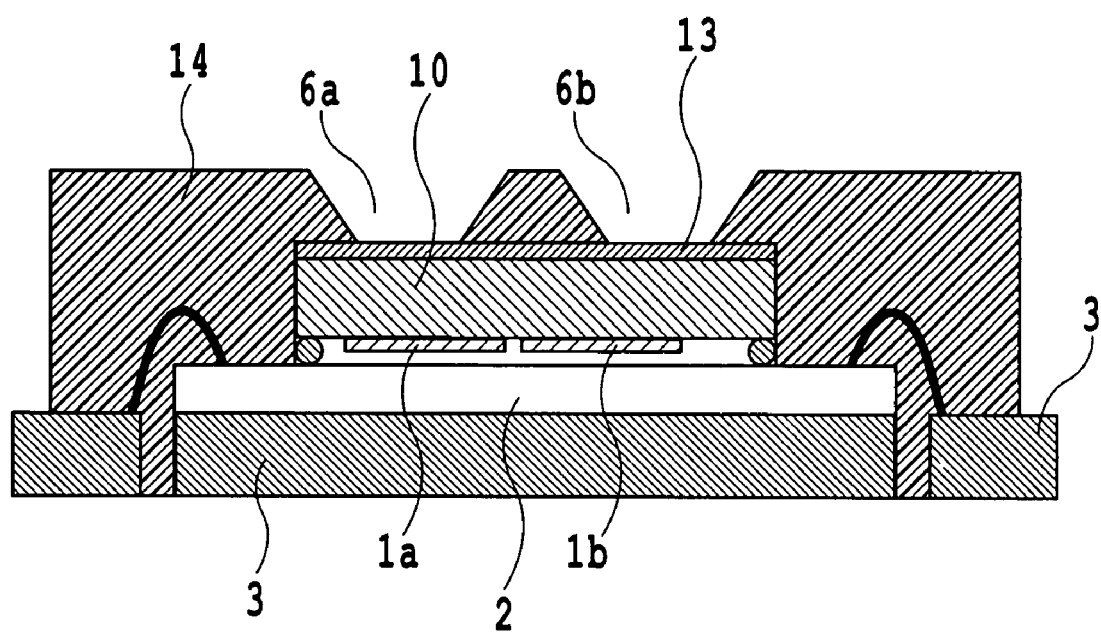
FIG. 6 is a cross-sectional view of an optical device having a large number of apertures according to the one embodiment of the present invention.

Additionally, an optical device having a large number of photoelectric conversion portions provided inside the same sealing material 14, and having a large number of optical window elements can be assumed. Unlike the structure shown in FIG. 1F where there the aperture 6 is provided singly, FIG. 6 shows a cross-sectional view of an optical device having an aperture 6a and an aperture 6b. In the case of using such a structure as an optical sensor, a movement of an object that is a light source against the sensor, can be detected by having a photoelectric conversion portion 1a and a photoelectric conversion portion 1b, which detect light entering the aperture 6a and the aperture 6b. As the simplest method of signal processing, there is a method of outputting to the outside, a difference amount between output signals of the photoelectric conversion portion 1a and the photoelectric conversion portion 1b in the form of an analogue or digital signal.

Additionally, in a configuration as shown in FIG. 7, a plurality of photoelectric conversion elements may be arranged side by side, and at least one of the photoelectric conversion elements may have the optical window element to be used for photoelectric conversion, whereas the others may be used for correction of temperature change, using an electric characteristic and a change thereof of a photoelectric conversion element.

Moreover, it is also possible to electrically join one or more of the photoelectric conversion elements to each other, electrically join another one or more of the photoelectric conversion elements, and provide these on one substrate. Here, apertures can be provided so that light can enter or exit both of the former one or more of the photoelectric conversion elements and the later one or more of them, and alternatively, so that light can enter or exit any one of them.

Although description has been given so far by using examples of a passive optical device hereinabove, the present invention can be applied to an active optical device. Hereinbelow, an active optical device having a self-emitting function will be described.

Figure 8:
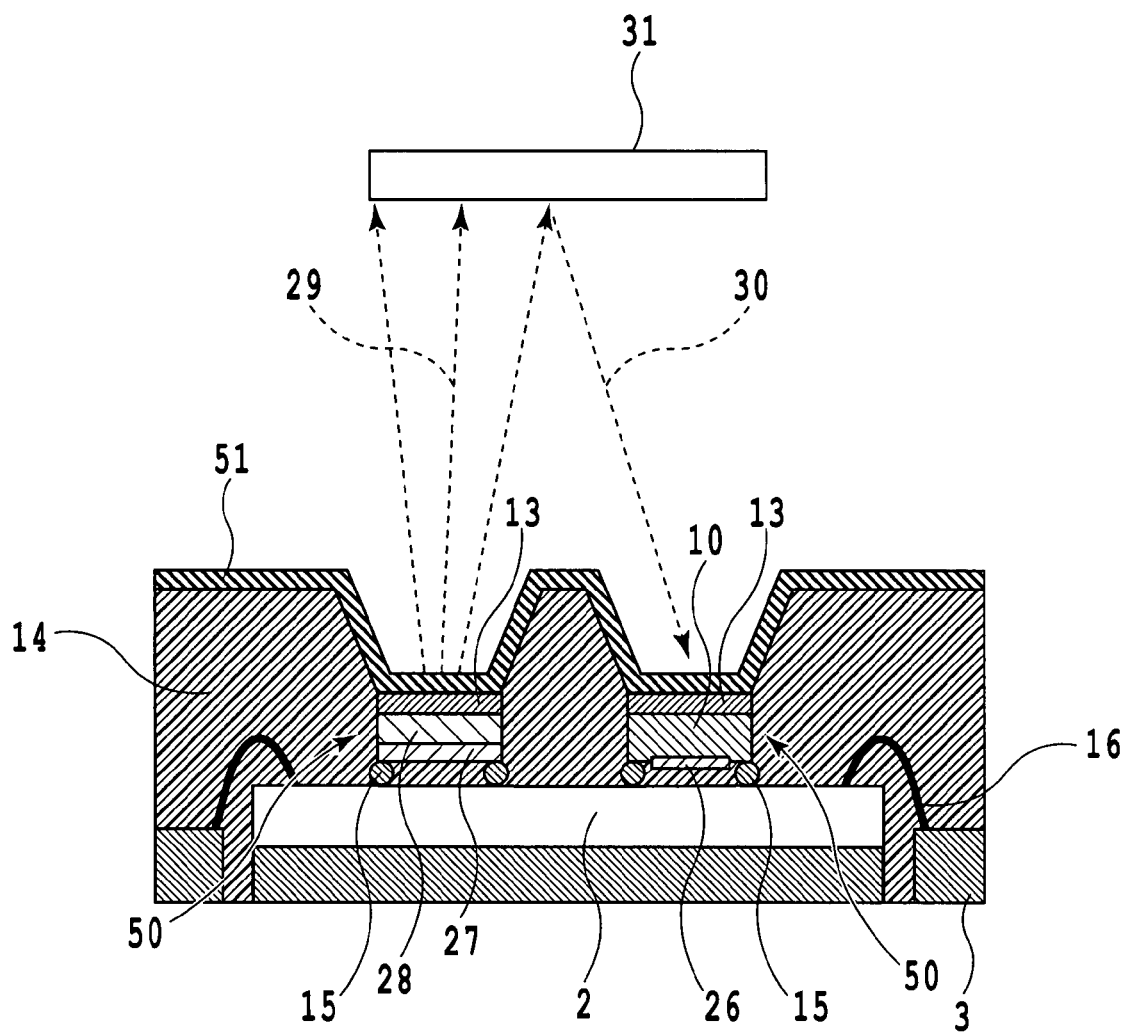
FIG. 8 is a cross-sectional view of an active infrared sensor according to the one embodiment of the present invention.

As shown in FIG. 8, an active optical device that is miniature and has a small number of manufacturing steps and parts can be realized by mounting a light emitting portion 27 and a light receiving portion 26 into the same sealing material 14. In FIG. 8, the light emitting portion 27 and the light receiving portion 26 are both electrically connected to the signal processing circuit 2 through the connection wiring 15. Additionally, the light emitting portion 27 is formed on a light emitting portion substrate 28 to compose one of the photoelectric conversion elements 50, whereas the light receiving portion 26 is formed on the light receiving portion substrate 10 to compose another one of the photoelectric conversion elements 50. In addition, each of the substrates (the light emitting portion substrate 28 and the light receiving portion substrate 10) is located in a side opposite to the side where the signal processing circuit 2 is formed. It goes without saying that the light emitting portion substrate 28 has a high transmittance for a wavelength of light emitted from the light emitting portion 27.

At least a part of the back face (with respect to the substrate on which the light emitting portion is formed, a face opposite to a face on which the light emitting portion is formed) of the light emitting portion substrate 28, is exposed as in the case with the light receiving portion substrate 10. A protective layer 51 may be, when needed, formed on the exposed face, as shown in FIG. 8.

Also in the active optical device shown in FIG. 8, it is necessary that a part of each of the elements be exposed in order to allow light to enter and exit the photoelectric conversion portions provided as the light emitting portion 27 and the light receiving portion 26. When apertures are formed in the sealing material 14 in order to allow the exposure, the light emitting portion 27 and the light receiving portion 26 became exposed from a bottom face of the respective apertures through the protective layer 51, the optical adjustment elements 13 and the substrates. Therefore, the bottom faces of each aperture becomes an interface between the outside and the light emitting portion 27, and an interface between the outside and the light receiving portion 26, which will form the optical windows for the light signal. As the light emitting portion 27, an LED (Light Emitting Diode) or LD (LASER Diode) that emits light, which has a wavelength that can be detected by the light receiving portion 26, may be used.

In the case of the active optical device, when a detection object 31 which reflects infrared light comes close to a sensor, the infrared light 29 emitted by the light emitting portion 27 is reflected by the detection object 31, and the detection object 31 comes to be detected by the light receiving portion 26. While the signal processing circuit 2 in the case of the active optical device performs the same operations as in the cases of the passive optical devices, it is necessary that the signal processing circuit 2 be provided with a power source for the light emitting portion.

Note that, although a signal transfer element (the signal processing circuit 2) is provided between the photoelectric conversion portion 1, provided as the light emitting portion 27 and the light receiving portion 26, and the connection terminal 3 in an above described structure, the present invention is not limited to this, and it is not always necessary to provide the signal transfer element (the signal processing circuit 2). That is, the photoelectric conversion elements 50 may be provided directly on the connection terminal 3 through the connection wiring 15. At this time, when an aperture (for example, the aperture 7 in FIG. 1I) is formed in the connection terminal side, the aperture may be provided between the connection wiring 15 because electrical connection of the photoelectric conversion elements 50 with the connection terminal 3 must be established. Note that the photoelectric conversion element functioning as the light receiving portion, and the photoelectric conversion element functioning as the light emitting portion may be electrically joined or unjoined, and are designed as appropriate in consideration of the purpose and productivity.

(Manufacturing Method of an Optical Device)

Next, a manufacturing method of an optical device of the present invention will be described.

The manufacturing method of an optical device of the present invention is characterized in that an interface between the outside and an element that is the closest to the outside in an optical device using a sealing material, that is, a optical window element, for derivation or introduction of light is formed by utilizing a sealing material (a sealing package) using the sealing material. For that purpose, an aperture for derivation or introduction of light is formed in the sealing material or the connection terminal. As a result, the manufacturing method of the present invention can be broadly applied to optical devices each requiring an aperture.

A basic concept of the manufacturing method of an optical device of the present invention is shown in FIGS. 9A to 9H.

The substrate 10 becomes a seating of the photoelectric conversion portion 1, and, although the material is not limited as long as it is a substrate on which formation of the photoelectric conversion portion 1 is possible, a substrate having a high transmittance for a range of operational wavelengths of the optical device is desirable in the case of such an optical device as shown in FIG. 1A because the optical window element becomes the substrate 10 itself. For example, in the case of an optical device handling wavelengths of not less than 1 µm, the substrate 10 may be a substrate made of Si, GaAs, sapphire or the like. The optical adjustment element 13 designates, as has been described above, a region which is formed by surface treatment of some sort in the optical window element, and adjusts the optical derivation or introduction characteristics.

A basic flow of the manufacturing method of an optical device of the present invention will be described by using FIGS. 9A to 9H.

Figure 9A:
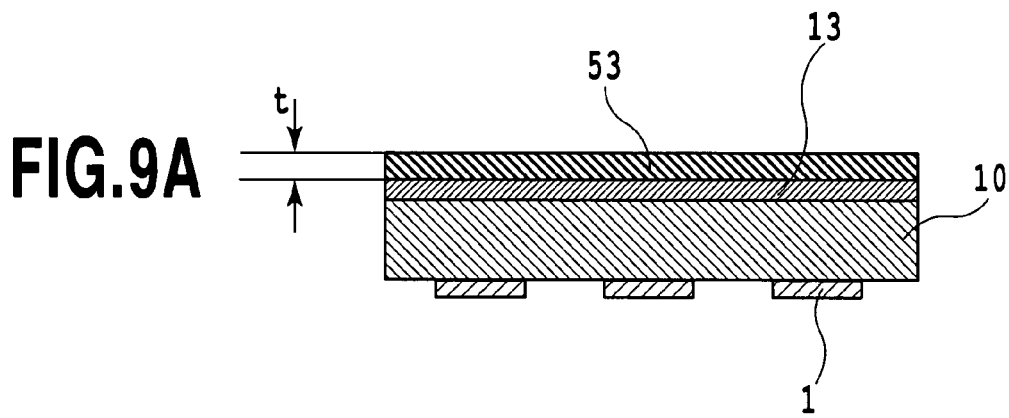
FIG. 9A is a schematic view of a manufacturing method of an optical device not provided with the signal processing circuit according to the one embodiment of the present invention.

Firstly, the substrate 10 having the photoelectric conversion portion 1 formed on one of faces thereof and having the optical adjustment element 13 formed on a face thereof opposite to the one of the faces is prepared. Note that, although the optical adjustment element 13 is formed in FIGS. 9A to 9H, the present invention does not necessarily require the optical adjustment element 13. Next, as shown in FIG. 9A, a first protective film forming step is carried out where a first protective film 53 is formed on the optical adjustment element 13. In a case where the optical adjustment element 13 is not formed, it is only necessary to form the first protective film on a face of the substrate 10 which is opposite to a face thereof on which the photoelectric conversion portion 1 has been formed.

A role of the first protective film 53 is, as will be described later, to protect the optical window element or the optical adjustment element 13 during an aperture forming step with respect to the sealing material. Although a material of the first protective film 53 is not limited to particular kinds of materials, as will be described later, a material that can endure a physical etching method used in the aperture forming step, a material whose etching rate in the aperture forming step is lower than that of the sealing material is preferably used. The thickness of the first protective film is not particularly limited, and is selected as appropriate in combination with the etching rate so that variation of thicknesses of members represented by the substrate, variations in etching speed in the aperture forming step, and the like can be absorbed. In terms of suppression of these variations, not less than 2 µm is preferable, not less than 5 µm is more preferable, and having a thickness of not less than 10 µm is still more preferable.

On the other hand, in a case where, by using a method of previously forming the first protective film, joining of the connection terminal and the photoelectric conversion portion is performed by flip-chip bonding, because it is necessary to transmit energies in the forms of an ultrasonic wave, pressure, and the like through the first protective film, not more than 100 µm is preferable for the thickness of the first protective film, and not more than 50 µm is still more preferable. However, it depends on the quality of the material, hardness according to it, and the like. Additionally, as will be described later, the aperture can be changed into a desired shape by patterning the first protective film 53. In this case, a protective film having photosensitivity, such as a liquid or film photosensitive resist, is desirable so that the patterning using a photolithography technique can be preformed thereon. In particular, in the case having such a structure as shown in FIG. 1B, and having such functions as a function by which a part of a face having the optical window is unexposed and is fixed to the connection terminal, a material that can be patterned is preferable for the first protective film, and a photoresist is preferable as the material. This is because it is preferable that, while only a portion where the optical window exits should be protected, and a portion making contact with the connection terminal should not be protected.

Additionally, any one of coating methods represented by a spin coater is normally used in the case of using a liquid resist, whereas a laminator is normally used in the case of using a film resist. In a case where the protective film is photosensitive and is required to be patterned, a pattern is formed by being exposed to light through a mask in which a desired pattern is formed, and then being processed for development. Additionally, it is also possible to form the pattern by applying an inkjet method by using a liquid resist.

Figure 9B:
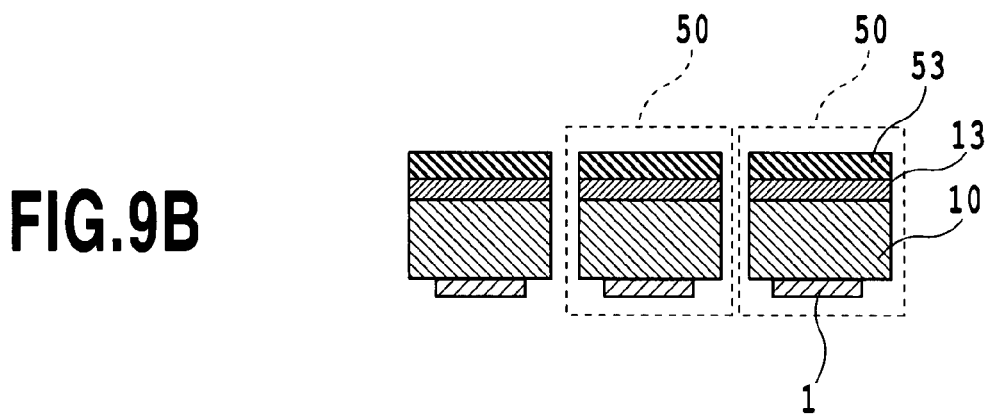
FIG. 9B is a schematic view of the manufacturing method of the optical device not provided with the signal processing circuit according to the one embodiment of the present invention.

Next, as shown in FIG. 9B, by carrying out a step of dicing the substrate 10 on which the first protective film 53 has been formed, a large number of the photoelectric conversion elements 50 formed on the same substrate are separated.

Figure 9C:
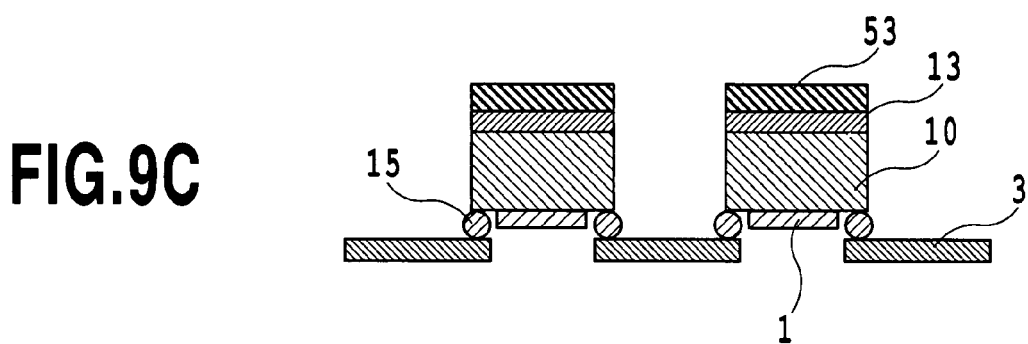
FIG. 9C is a schematic view of the manufacturing method of the optical device not provided with the signal processing circuit according to the one embodiment of the present invention.

Additionally, as shown in FIG. 9C, an assembling step of fixing onto the connection wiring 3 the photoelectric conversion elements 50 obtained in the dicing step, and additionally, making electrical connection of the photoelectric conversion elements 50 with the connection terminal 3. The electrical connection of the photoelectric conversion elements 50 with the connection wiring 3 is made by the connection wiring 15.

Although this first protective film forming step may be performed after the separated photoelectric conversion elements are connected with the connection terminal, a method where the first protective film is previously formed on the substrate and is diced with the substrate as shown in FIG. 9B is preferable as it can increase production efficiency. In a case where the optical device of the present invention is miniature, especially, an effect of previously placing the first protective film becomes remarkable because the substrate is separated into a large number of pieces by dicing. Additionally, in a case where the first protective film forming step may be performed after the separated photoelectric conversion elements are connected with the connection terminal, a film photosensitive resist is preferably used for the first protective film because the first protective film is formed in a state where the photoelectric conversion elements have been separated.

In order to increase manufacturing efficiency, it is desirable that a lead frame (used in manufacturing method of semiconductor devices) be utilized for the connection terminal 3. Additionally, as specific methods of forming the connection wiring, wire bonding and flip-chip bonding can be listed. A flip-chip bonding method is a method suitable for connecting, as shown in FIG. 9C, two electrodes (elements for obtaining electrical conduction) facing each other. In the present invention, since light is not blocked by a metal wiring, allowing efficient reception and emission of light, the flip-chip bonding method is preferably used in cases where light enters or exit through the side of the photoelectric element having the back face opposite to the face on which the photoelectric conversion portion is formed. In the case of using the flip-chip bonding method, any one of wiring obtained by solidifying a paste of solder, metal or carbon, film wiring with a conductive material being dispersed thereon, and the like in addition to metal projections such as a metal ball and metal bumps can be used as the metal wiring, and the metal wiring is connected by a method such as thermocompression bonding or ultrasonic bonding depending on the material and a characteristic thereof. Among these, a method in which ultrasonic bonding is used while any one of metal projections is used as the connection wiring is preferable because high reliability can be attained thereby. In the case of applying the manufacturing method of an optical device of the present invention to a light receiving or light emitting element intended for the infrared region having sensitivity wavelengths that are suitable to the optical device of the present invention, especially, the ultrasonic bonding method is suitably used because the photoelectric conversion element becomes sensitive to heat in many cases.

Additionally, in the case of using the flip-chip bonding, it becomes a desirable method also from the perspective that a miniaturized optical device can be realized.

Figure 9D:
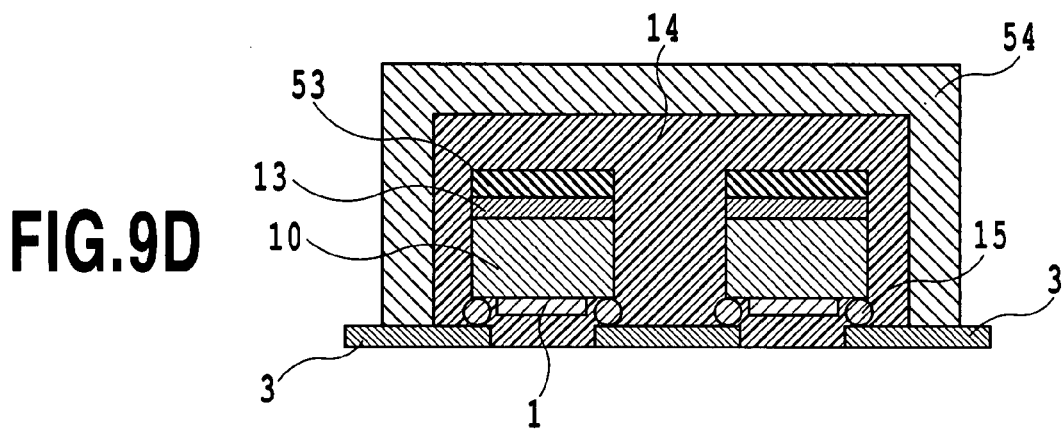
FIG. 9D is a schematic view of the manufacturing method of the optical device not provided with a signal processing circuit according to the one embodiment of the present invention.

Next, as shown in FIG. 9D, a sealing step of forming the sealing material is performed by utilizing a mold 54. In this step, the same molding method as a package molding method used in semiconductor manufacturing processes is generally used.

Figure 9E:
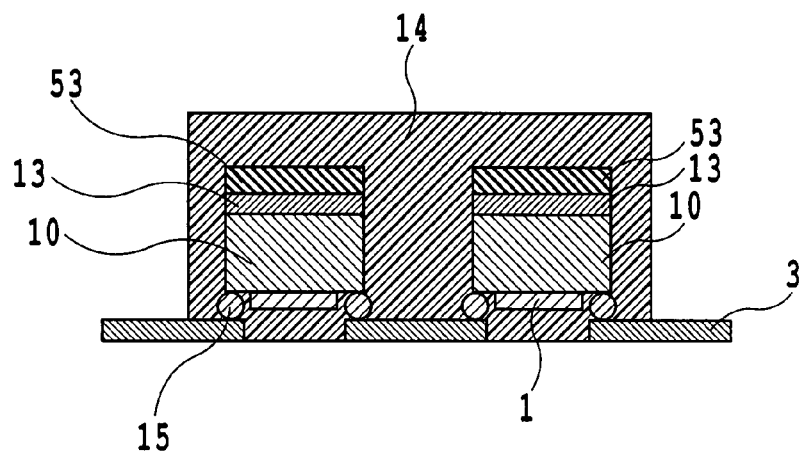
FIG. 9E is a schematic view of the manufacturing method of the optical device not provided with the signal processing circuit according to the one embodiment of the present invention.

Next, by taking out the photoelectric conversion elements 50 sealed by the sealing material 14 from the mold 54, a structure as shown in FIG. 9E is obtained. In a case where a lead frame is used as the connection terminal 3, the sealing step makes it possible to seal a massive amount of the photoelectric conversion elements 50 in one operation, whereby production efficiency can be increased. In the sealing step, parts of the connection terminals 3, the connection wiring 15 and the photoelectric conversion elements 50 come to be sealed by the same sealing material 14. In addition, the optical window has not yet been formed in this phase.

Next, the aperture forming step of opening the aperture (a through hole) in the sealing material 14, which is performed for exposing the optical window for derivation or introduction of light, will be described.

Although a method of forming an aperture in the manufacturing method of an optical device of the present invention may be any one of an etching method utilizing a physical technique, and a chemical etching method, a physical etching method is preferable in consideration of production efficiency and processing accuracy. As the etching method utilizing a physical technique, a polishing method and a sandblasting technique can be exemplified. In the case of using a sealing resin mixed with a filler which is broadly used for a sealing material, especially, use of a wet or dry sandblasting technique is desirable because the use thereof makes it likely that a flaw will be generated in the optical window or the optical adjustment element thereof. The wet sandblasting technique is preferable because, as generation of static electricity is minor, damage to the optical device becomes less, whereas in other cases the dry sandblasting technique is preferable because, as it does not require waste liquid processing and the like, productivity is improved. Any one of these techniques is selected in consideration of a characteristic of the optical device and productivity.

Figure 9F:
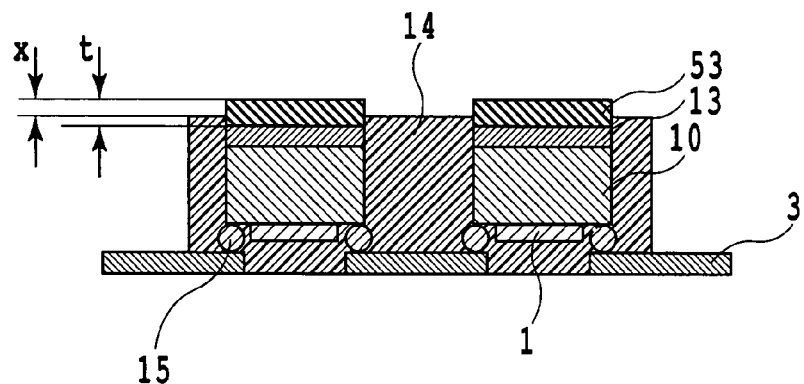
FIG. 9F is a schematic view of the manufacturing method of the optical device not provided with the signal processing circuit according to the one embodiment of the present invention.

As shown in FIG. 9F, it is desirable that the sealing material 14 be etched so that at least a part of the first protective film 53 can be exposed. Additionally, as shown in FIG. 9F, if the thickness of the first protective film 53 is denoted as t, it is desirable that etching be performed to a depth x ($0 \leq x \leq t$) from the surface of the first protective film. By controlling this etching depth x, the photoelectric conversion element is prevented from protruding from the sealing material, and is prevented from being etched during the etching process. That is, even if physical etching such as sandblast is performed, damaging an exposed surface of the photoelectric conversion element, and excessively scooping the exposed surface can be prevented or reduced. This exerts its power when an element not desired to be flawed or to be excessively scooped has been formed on the back face of the substrate 10. A purpose of providing the first protective film 53 is to protect the optical window against etching, at the time of etching such as sandblasting. Therefore, the purpose is to protect the exposed surface of the substrate 10 in a case where the optical adjustment element 13 has not been formed, or to protect an exposed surface of the optical adjustment element 13 in a case where this optical adjustment element 13 has been formed. Additionally, the optical field of view of the optical device can be adjusted into a desired angle. Additionally, as will be described later, the shape of the optical window can be changed by patterning the first protective film 53, whereby the optical field of view of the optical device can be set to a desired value.

Figure 9G:
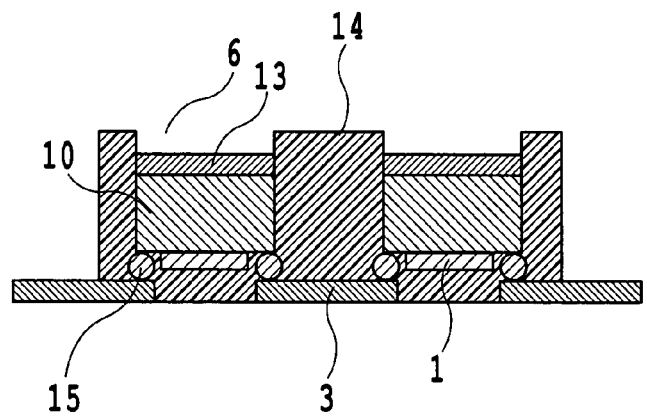
FIG. 9G is a schematic view of the manufacturing method of the optical device not provided with the signal processing circuit according to the one embodiment of the present invention.

Next, a protective film removing step of removing the first protective film 53 is performed. By performing the protective film removing step, a structure shown in FIG. 9G is obtained. Here, because the sealing material 14 has been etched with the depth x ($0 \leq x \leq t$), a region from which the first protective film 53 is removed becomes the aperture 6. At this time, because the first protective film 53 has been formed directly on the optical adjustment element 13, as shown in FIG. 9C, the optical adjustment element 13 comes to be exposed from the region from which the first protective film 53 has been removed. That is, the optical adjustment element 13 comes to be exposed from a bottom face of the aperture 6. Note that, in a case where the optical adjustment element 13 is not formed, as the first protective film 53 is formed directly on the substrate 10 in FIG. 9C, a surface of the substrate 10 comes to be exposed when the first protective film 53 is removed. Here, a large amount of the photoelectric conversion portions come into a state being fixed on the same connection terminal 3, and being sealed by the sealing material having the apertures 6 formed therein.

Additionally, at the time of the above etching, if etching is performed until the depth x equals to the thickness t, the apertures are not formed or come to have a very shallow depth even if the apertures are formed. However, when the first protective film 53 is removed, the sealing material 14 does not exist on regions corresponding to the optical windows in the sealing material 14, whereby the optical adjustment elements 13 can be exposed from the optical windows. By forming the optical device in this way, the optical device shown in FIG. 1H can be formed.

Figure 9H:
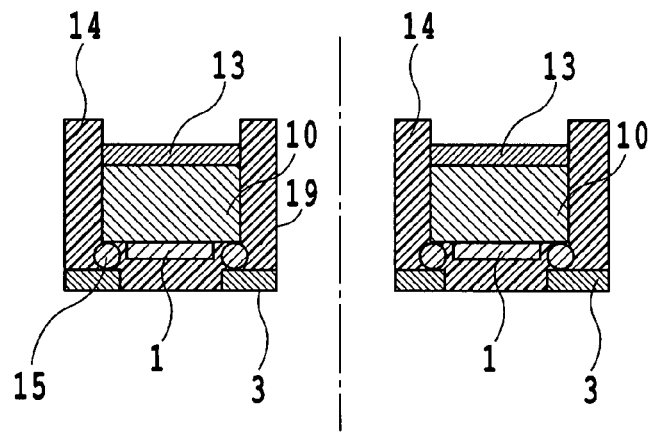
FIG. 9H is a schematic view of the manufacturing method of the optical device not provided with the signal processing circuit according to the one embodiment of the present invention.

Lastly, as shown FIG. 9H, a structure shown in FIG. 9H is diced in order to separate the devices. In this dicing step, final dimensions of the optical device are determined.

Additionally, while etching of a predetermined element of the sealing material 14 is required in order to form the aperture as shown in FIG. 1G, nonselective etching in which etching is performed on an entirety of the sealing material 14 may be performed instead of selectively forming the aperture 6. FIG. 1H can be obtained also by this nonselective etching. By thus performing the etching, the sandblast etching step can be simplified. Here, the optical field of view 16 of a sensor is determined by the thickness of the substrate 10, and the area of the photoelectric conversion portion 1.

In forming the aperture 6, although the sandblast etching is used here so that the sealing resin 14 can be physically shaved, chemical etching may be used instead.

In the aperture forming step of the manufacturing method of an optical device which has been described by using FIGS. 9A to 9H, a face of the optical device opposite to a face thereof formed by the connection terminal 3 is evenly etched by use of sandblasting, whereby the aperture comes to have a shape of the first protective film 53. At this time, in accordance with need, there may be provided, between the abovementioned sealing step and the abovementioned aperture forming step, a second protective film forming step of forming, on a face of the abovementioned sealing material on which the aperture is formed, a second protective film which protects at least a part of the sealing material except for the aperture.

The second protective step is preferably used in the case of performing selective etching, and a material having photosensitivity represented by a liquid or film resist is preferably used as will be described later. The second protective film forming step is performed between the abovementioned sealing step and the abovementioned aperture forming step, and is a step of forming, so as to protect at least a part of the sealing material except for the aperture, the second protective film on the face of the abovementioned sealing material on which the aperture is formed. As a material for the second protective film, any one of materials such as those having been described in relation with the first protective film can be used, and each of the materials can be formed by any appropriate one of methods such as those having been described in relation with the first protective film.

In the case of performing selective etching by using the second protective film, it is preferable that a wet or dry sandblasting technique be used in the aperture forming step. Alternatively, chemical etching can be used. In this case, a combination of the first protective film, the second protective film and the sealing material where they are different in solubility against an etchant served for the chemical etching is preferable, and formation of the aperture is performed by controlling dissolution characteristics and the thickness.

Next, a manufacturing method of an optical device using a signal transfer element will be described by using FIGS. 10A to 10J.

Figure 10F:
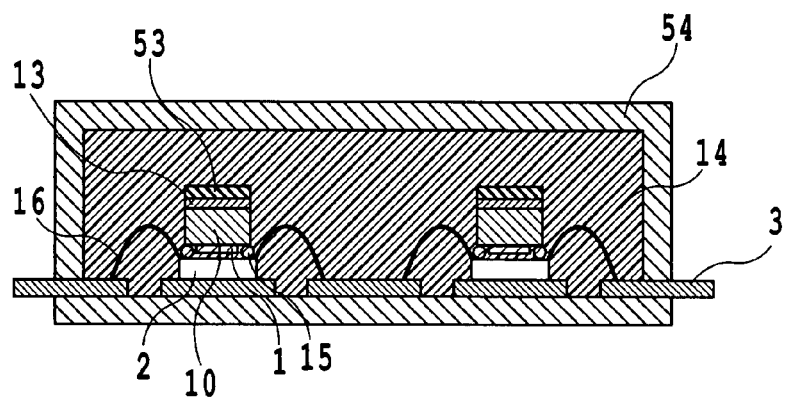
FIG. 10F is a schematic view of the manufacturing method of the optical device provided with the signal processing circuit according to the one embodiment of the present invention.

Firstly, the substrate 10 having the photoelectric conversion portions 1 formed on one face thereof, and having the optical adjustment elements 13 formed on a face thereof opposite to the one face is prepared. Note that, although the optical adjustment elements are formed in FIGS. 10A to 10J, the optical adjustment elements 13 are not essential. As shown in FIG. 10A, the protective film forming step of forming the first protective film 53 on the optical adjustment elements 13 is performed. The role of the first protective film 53 is, as will be described later, to protect the optical window or the optical adjustment element 13 during the aperture forming step with respect to the sealing material. As will be described later, the aperture may be changed into a desired shape by patterning the first protective film 53. In this case, a protective film having photosensitivity, such as a photosensitive resist, is desirable so that the patterning using a photolithography technique can be preformed thereon.

Next, as shown in FIG. 10B, by carrying out the step of dicing the substrate 10 on which the first protective film 53 has been formed, a large number of the photoelectric conversion elements 50 formed on the same substrate are separated.

An assembling step of fixing the signal processing circuits 2 as the signal transfer elements onto the connection terminals 3 as shown in FIG. 10C, then fixing the photoelectric conversion elements 50 onto the signal processing circuits 2 as shown in FIG. 10D, and additionally, making electrical connection of the photoelectric conversion elements 50 with the signal processing circuits 2 is performed.

Additionally, as shown in FIG. 10E, electrical connection of the signal processing circuits 2 with the connection terminals 3 is made through the connection wiring 16 by using a wire bonding technique. In order to increase manufacturing efficiency, it is desirable that a lead frame used in a manufacturing method of a semiconductor device be utilized for the connection terminal 3.

Additionally, as shown in FIG. 10F, the sealing step of forming the sealing material is performed by utilizing the mold 54. In this step, the same molding method as a package molding method used in semiconductor manufacturing processes may be used.

Figure 10G:
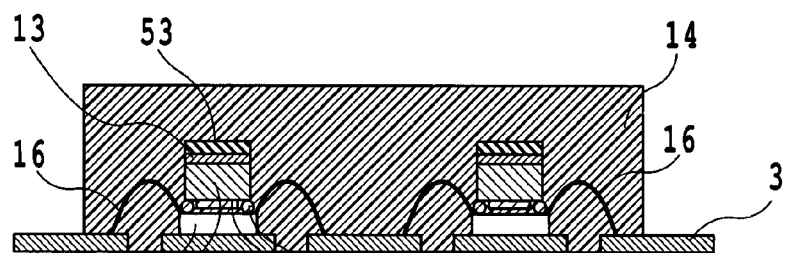
FIG. 10G is a schematic view of the manufacturing method of the optical device provided with the signal processing circuit according to the one embodiment of the present invention.

Next, by taking out the photoelectric conversion elements 50 sealed by the sealing material 14 from the mold 54, a structure as shown in FIG. 10G is obtained. In a case where a lead frame is used as the connection terminal 3, the sealing step makes it possible to seal a massive amount of the photoelectric conversion elements 50 in one operation, whereby production efficiency can be increased. In the sealing step, parts of the connection terminals 3, the connection wiring 16, the signal processing circuits 2 and the photoelectric conversion elements 50 are sealed by the same sealing material.

Figure 10H:
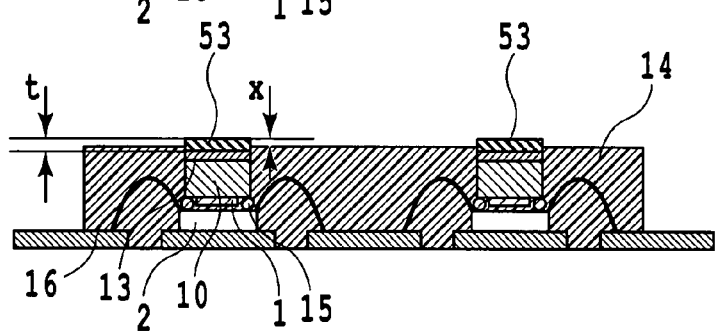
FIG. 10H is a schematic view of the manufacturing method of the optical device provided with the signal processing circuit according to the one embodiment of the present invention.

Next, the aperture forming step of opening the apertures (through holes) in the sealing material 14 in order to expose the optical window elements for derivation or introduction of light will be described. This step is performed in the same manner as the aforementioned aperture forming step (having been described by using FIG. 9F, not including the signal processing circuit). That is, although this etching method can be any one of chemical etching, and an etching method utilizing a physical technique, a physical etching technique is preferably used in consideration of production efficiency and processing accuracy. In the case of using a sealing resin mixed with a filler which is broadly used for a sealing material, especially, use of a wet or dry sandblasting technique is desirable because the use thereof makes it less likely that a flaw will be generated in the optical window or the optical adjustment element thereof. As shown in FIG. 10H, it is necessary that the sealing material 14 be etched so that at least a part of the first protective film 53 can be exposed. Additionally, as shown in FIG. 10H, if a thickness of the first protective film 53 is denoted as t, it is desirable that etching be performed to a depth x ($0 \leq x \leq t$) from a surface of the first protective film. By controlling this etching depth x, the optical field of view of the optical device can be adjusted into a desired angle. Additionally, as will be described later, the shape of the optical window can be changed by patterning the first protective film 53, whereby the optical field of view of the optical device can be set to a desired value.

Figure 10I:
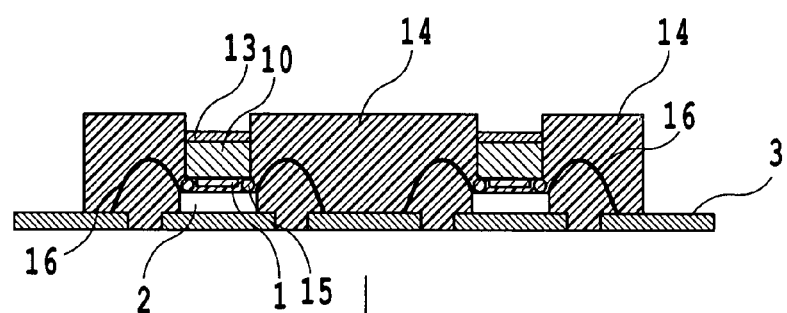
FIG. 10I is a schematic view of the manufacturing method of the optical device provided with the signal processing circuit according to the one embodiment of the present invention.

After regions becoming the apertures 6 are formed, a protective film removing step to remove the first protective film 53 is performed. After the protective film removing step, a structure shown in FIG. 10I is obtained. Here, a large amount of the photoelectric conversion elements come into a state being fixed on the same connection terminal 3, and being sealed by the sealing material having the apertures 6 formed therein.

Additionally, in this case also, as has been described above, the second protective film forming step may be performed between the sealing step and the abovementioned aperture forming step in accordance with need.

Figure 10J:
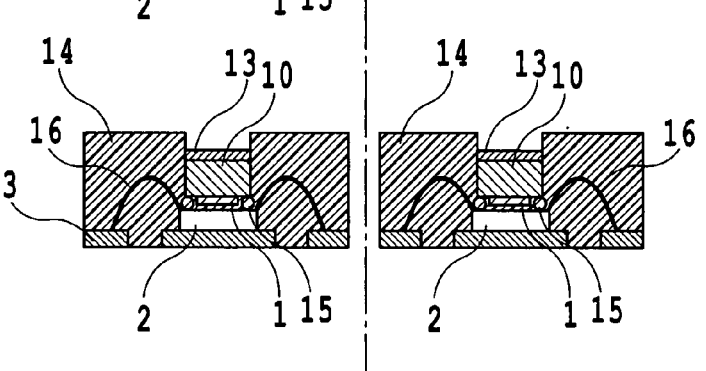
FIG. 10J is a schematic view of the manufacturing method of the optical device provided with the signal processing circuit according to the one embodiment of the present invention.

Lastly, as shown FIG. 10J, a structure in FIG. 10H is diced in order to separate the devices. In this dicing step, final dimensions of the optical device are determined.

The manufacturing methods of an optical device described by using FIGS. 9A to 9H and FIGS. 10A to 10J are not limited to an optical device in which protection of a optical window element (an interface between the outside and the optical adjustment element in a case having the optical adjustment element formed, or an interface between the outside and any one of the photoelectric conversion element, the signal processing circuit and the like in a case not having the optical adjustment element formed) is essential, and the manufacturing methods can be applied to an optical device not requiring protection of the optical window in manufacturing steps thereof. In this case, when the aperture is formed in the sealing material, it is necessary that the formation be performed by a method that does not break the optical window. Because any generally used substrate made of Si, GaAs or the like comes to be etched under sandblast etching conditions for etching a usually used sealing resin, it is desirable that the optical window be protected before an aperture forming step.

The manufacturing method of the present invention can be effectively applied even to an optical device having the optical window formed into a mirror surface, and not including an optical adjustment element. In the aperture forming step, while the optical window may possibly be flawed or destroyed particularly in the sealing step if a conventional manufacturing method is utilized, flaws on and destruction of the mirror surface can be prevented by using the manufacturing method of the present invention, whereby a very highly reliable manufacturing method of an optical device can be realized.

Additionally, in the aperture forming step of the manufacturing method of the present invention, in some cases, it is preferable that the second protective film which protects at least a part of the sealing material except for the aperture be provided on a face of the sealing material on which the aperture is formed.

Figure 11A:
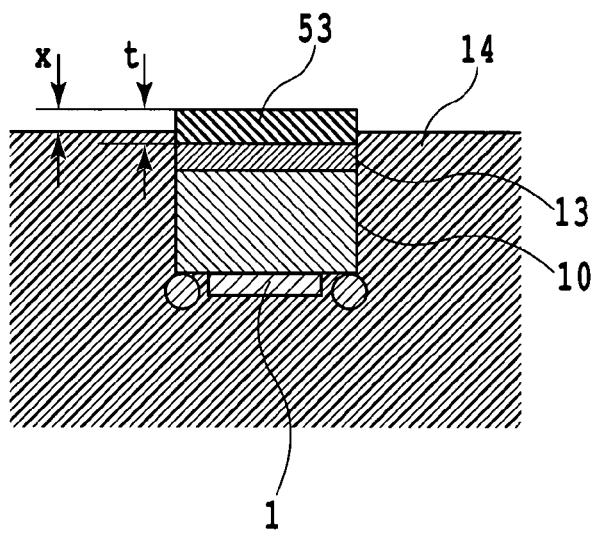
FIG. 11A is an explanatory view of a forming method of the second protective film according to one embodiment of the present invention.
Figure 11B:
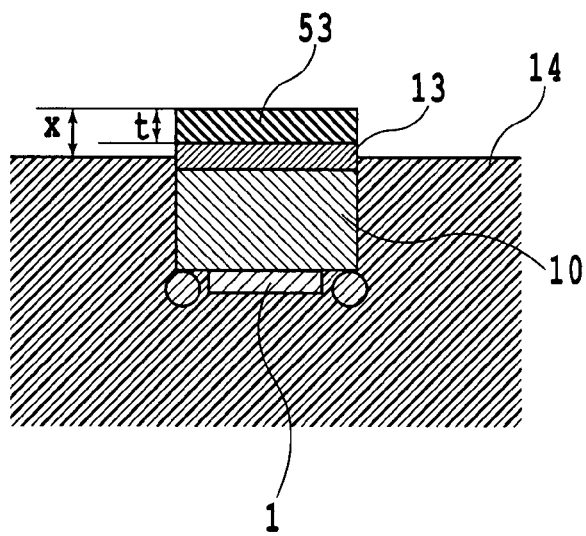
FIG. 11B is an explanatory view of a forming method of the second protective film according to the one embodiment of the present invention.

For example, as shown in FIG. 11A, in a case where the etching depth x is smaller than the thickness t of the first protective film 53, the first protective film becomes difficult to be removed in some cases. In contrast, as shown in FIG. 11B, in a case where the etching depth x is made larger than t, the first protective film becomes easy to be removed. However, in a final form of an optical device, the photoelectric conversion portion comes into a state protruding with respect to a surface of the sealing material 14, and the optical device becomes difficult to use depending on a purpose thereof in some cases.

Figure 11C:
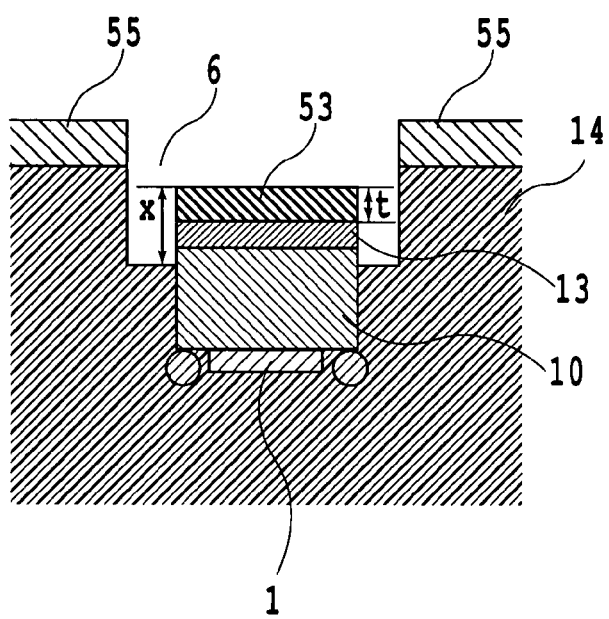
FIG. 11C is an explanatory view of a forming method of the second protective film according to the one embodiment of the present invention.

Here, as shown in FIG. 11C, the aperture 6 is formed after the second protective film 55 is formed, before the etching is performed, in a region on a surface of the sealing material 14, the region being distant by a predetermined distance from a region directly on the first protective film 53. Thereby, even if the etching depth x is made larger than t, the photoelectric conversion portion does not protrude from the sealing material 14. That is, a space equivalent only to the predetermined distance comes to be formed between a wall surface of the aperture 6 and the first protective film 53, a element where the first protective film and the sealing material make contact with each other is eliminated, whereby, with this space, it becomes easier to remove the first protective film 53. Therefore, removal of the first protective film 53 becomes easier, whereby an optical device becomes easy to manufacture and easy to use. Additionally, according to the method using the second protective film, an optical device can be designed so as to have the second protective film located on apex regions of metal wires, and a restriction on a height of the metal wires is eased in such an optical device (the structure in FIG. 10 can be exemplified) as having apexes of metal wires in the optical window side, whereby an optical device in which connection wiring is provided by using a wire bonding technique can be made more thinner, or more miniature.

Here, although the wall surface of the aperture 6 is formed perpendicularly in FIG. 11C, the wall surface of the aperture 6 sometimes comes to have an inclination because some over-etching sometimes occur during the formation of the aperture.

It is preferable that a material for the second protective film 55 be photosensitive so that it can be patterned by utilizing a photolithography method. Additionally, utilization of the second protective film can be applied to adjustment of the optical field of view of an optical device. Additionally, by utilizing a shape of the aperture formed by utilizing the second protective film, an optical device is designed so as to fit into the aperture an external lens of the optical device. Additionally, the case of performing the aperture formation by chemical etching is preferable because the optical window can be formed by utilizing the difference in solubility against an etchant between the second protective film and the sealing material. Note that, in accordance with need, the second protective film is removed after the aperture forming step.

Note that, in the present invention, without using the first protective film, after the photoelectric conversion element is sealed by the sealing material 14, the aperture may be formed so as to be exposed from the sealing material by physical and chemical etching.

Although methods of forming the aperture in the sealing material have been described in the above description, the following manner may be adopted in the case of providing an aperture in the connection terminal.

For example, before the photoelectric conversion portions 50 or the signal processing circuits 2 are mounted on the connection terminals 3, a pattern element penetrating each of the connection terminals is formed. Then, the photoelectric conversion portions 50 (or the signal processing circuits 2) are mounted on the connection terminals 3 so that a region of each of the photoelectric conversion portions 50 (or the signal processing circuits 2) which becomes the optical window can be exposed through the pattern. Subsequently, as shown in FIG. 9D, the photoelectric conversion elements 50 and the connection terminals 3 are sealed by the sealing material 14. At this time, the sealing material enters the pattern s (which become the optical window s later), and the sealing material having entered the pattern is removed by physical or chemical etching. With this removal, the abovementioned patterns become the optical windows.

Note that the optical windows may possibly be flawed during the etching performed on the patterns. In order to prevent or reduce the flawing on the optical windows, use of the first protective film is preferable.

In the case of using the first protective film, the first protective film may be formed, before the abovementioned mounting, in the regions of the photoelectric conversion portions 50 (or the signal processing circuits 2) which become the optical windows, or the first protective film may be formed, after the abovementioned mounting, on the optical windows exposed from bottom faces of the pattern elements. That is, it is only necessary that the first protective film are formed on the optical windows before etching for forming the apertures.

When the etching for forming the apertures is preformed, the aperture is formed by stopping the etching once a surface of the first protective film in the patterns is exposed, and then removing the first protective film.

Note that, by using the connection terminals each not including the pattern element, each of the apertures may be configured to be formed in the connection terminal so that an element (the photoelectric conversion element or the signal processing circuit) that is the closest to the outside in one side of an optical device having the connection terminals can be exposed by physical or chemical etching after the photoelectric conversion elements are mounted on the connection terminals.

As has been described above, according to the manufacturing method of an optical device of the present invention, an optical device that is highly reliable and excellent in photoelectric conversion characteristic can be easily manufactured. Especially when miniature optical devices are produced in a large quantity, productivity thereof is considerably improved.

INDUSTRIAL APPLICABILITY

The present invention relates to: a highly sensitive passive optical device or active optical device equipped with a miniature package; and a manufacturing method thereof.

The invention claimed is:

1. An optical device comprising:
  a substrate having a first face and a second face, opposite said first face;
  a photoelectric conversion element having a photoelectric conversion portion which is formed on the first face of the substrate;
  a connection terminal electrically connected to the photoelectric conversion element;
  a sealing material which seals the photoelectric conversion element and the connection terminal;
  an optical adjustment element formed on the second face of the substrate to provide an interface for the light to propagate to or from; and
  an aperture that exposes the optical adjustment element on one side of the optical device through which light is allowed to enter from outside of said optical device or exit to the outside of the optical device.

2. The optical device according to claim 1, wherein the element that is the optical adjustment element is formed integrally with the photoelectric conversion element.

3. The optical device according to any one of claims 1 and 2, wherein the optical adjustment element is a light anti-reflection element.

4. The optical device according to claim 3, wherein the light anti-reflection element is a scattering control layer.

5. The optical device according to claim 1, wherein the photoelectric conversion element performs any one of detection and emission of light in an infrared region.

6. The optical device according to claim 1, wherein the photoelectric conversion element is a quantum type photoelectric conversion element capable of operation at a room temperature.

7. The optical device according to any one of claims 5 and 6, wherein the photoelectric conversion element is formed by connecting in series a plurality of photoelectric conversion elements.

8. The optical device according to claim 6, wherein the quantum type photoelectric conversion element belongs to at least any one of a photoconductor type, a photodiode type, a phototransistor type and a LASER diode type; and
  the quantum type photoelectric conversion element comprises a layer formed of a semiconductor containing at least any one of In and Sb, and a barrier layer for diffusion current suppression.

9. The optical device according to claim 1, wherein the photoelectric conversion element comprises:
  a first face including the aperture through which light enter or exits;
  a second face formed opposite to the first face, wherein the second face includes at least any one of a shielding plate which absorbs electromagnetic noise; and
  a light reflection plate which increases the absorption or emission efficiency for the light.

10. The optical device according to claim 1, wherein the light enters into or exits from the sealing material and the connection terminal through the aperture.

11. The optical device according to claim 1, wherein the photoelectric conversion element and the connection terminal are connected to each other through a signal transfer element.

12. A method of manufacturing an optical device comprising a photoelectric conversion element having a photoelectric conversion portion which is formed on a first face of a substrate; an optical adjustment element formed on a second face of the substrate opposite the first face to provide an interface for the light to propagate to or from; a connection terminal electrically connected to the photoelectric conversion element; and a sealing material which seals the photoelectric conversion element and the connection terminal, the method comprising:
  forming a first protective film for protecting the optical adjustment element;
  sealing at least a part of the connection terminal and the photoelectric conversion element by using the sealing material;
  forming an aperture on one side of the optical device through which light is allowed to enter from outside of the optical device or exit to the outside of the optical device; and
  removing the first protective film, wherein the aperture that exposes the optical adjustment element is formed by removing the first protective film.

13. The method of manufacturing an optical device according to claim 12, wherein the optical adjustment element is formed integrally with the photoelectric conversion element.

14. The method of manufacturing an optical device according to any one of claims 12 and 13, further comprising separating elements in the optical device between the forming of the first protective film and the sealing.

15. The method of manufacturing an optical device according to claim 12, wherein, during aperture forming, if a thickness of the first protective film is denoted as t, etching is performed to a depth x ($0 \leq x \leq t$) from a surface of the first protective film by using the surface of the first protective film as a basis.

16. The method of manufacturing an optical device according to claim 12, wherein the aperture is formed by etching utilizing a physical technique.

17. The method of manufacturing an optical device according to claim 16, wherein the etching utilizing a physical technique is sandblast etching.

18. The method of manufacturing an optical device according to claim 12, wherein the aperture is formed, in the one side through which light is allowed to enter to or exit from the sealing material and the connection terminal.

19. The method of manufacturing an optical device according to claim 12, wherein the photoelectric conversion element and the connection terminal are connected to each other through a signal transfer element.

20. The method of manufacturing an optical device according to claim 12, wherein the aperture is formed in the sealing material; and
  the manufacturing method further comprising forming a second protective film on a face of the sealing material between the sealing and the aperture formation, the second protective film protecting at least a part of the sealing material except for the aperture, the face being intended to have the aperture formed thereon.

21. The method of manufacturing an optical device according to claim 12, wherein:
  the aperture is formed in the connection terminal;

the connection terminal has a penetrating pattern; and the sealing material having entered the pattern during the sealing is removed while forming the aperture.

22. The method of manufacturing an optical device according to claim 12, further comprising:

electrically connecting a signal transfer element and the photoelectric conversion element to each other;

electrically connecting the signal transfer element and the connection terminal to each other before the sealing, wherein the signal transfer element includes at least one of:

a signal processing circuit which processes an output from the photoelectric conversion element;

a driver circuit which drives an electric signal directed to the photoelectric conversion element; and an interposer which electrically connects the photoelectric conversion element and the connection terminal to each other, wherein during the sealing, at least a part of the connection terminal, the photoelectric conversion element and the signal transfer element are sealed by the sealing material.

* * * * *

UNITED STATES PATENT AND TRADEMARK OFFICE
CERTIFICATE OF CORRECTION

| | | |
|---|---|---|
| PATENT NO. | : 7,791,014 B2 | Page 1 of 1 |
| APPLICATION NO. | : 11/885887 | |
| DATED | : September 7, 2010 | |
| INVENTOR(S) | : Edson Gomes Camargo et al. | |

It is certified that error appears in the above-identified patent and that said Letters Patent is hereby corrected as shown below:

Claim 9, column 39, line 61, "light enter" should read --light enters--.

Signed and Sealed this
First Day of November, 2011

David J. Kappos
*Director of the United States Patent and Trademark Office*